US009553184B2

(12) United States Patent
Zitouni et al.

(10) Patent No.: US 9,553,184 B2
(45) Date of Patent: Jan. 24, 2017

(54) EDGE TERMINATION FOR TRENCH GATE FET

(71) Applicant: Freescale Semiconductor, Inc., Austin, TX (US)

(72) Inventors: Moaniss Zitouni, Gilbert, AZ (US);
Edouard de Frésart, Tempe, AZ (US);
Pon Sung Ku, Gilbert, AZ (US);
Ganming Qin, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/473,358

(22) Filed: Aug. 29, 2014

(65) Prior Publication Data

US 2016/0064546 A1 Mar. 3, 2016

(51) Int. Cl.

| H01L 29/78 | (2006.01) |
|---|---|
| H01L 29/66 | (2006.01) |
| H01L 29/06 | (2006.01) |
| H01L 21/265 | (2006.01) |
| H01L 21/768 | (2006.01) |
| H01L 29/423 | (2006.01) |

(52) U.S. Cl.
CPC ..... *H01L 29/7811* (2013.01); *H01L 21/26513* (2013.01); *H01L 21/76897* (2013.01); *H01L 29/063* (2013.01); *H01L 29/0696* (2013.01); *H01L 29/4236* (2013.01); *H01L 29/66666* (2013.01); *H01L 29/66734* (2013.01); *H01L 29/7813* (2013.01)

(58) Field of Classification Search
CPC ........................ H01L 29/7811; H01L 29/66666
See application file for complete search history.

(56) References Cited

U.S. PATENT DOCUMENTS

| 5,355,008 A | * | 10/1994 | Moyer | ................ H01L 23/4824 257/341 |
|---|---|---|---|---|
| 5,814,858 A | * | 9/1998 | Williams | ............ H01L 29/7828 257/328 |
| 5,973,361 A | * | 10/1999 | Hshieh | .............. H01L 21/26586 257/330 |

(Continued)

OTHER PUBLICATIONS

Non-Final Office Action mailed Sep. 23, 2015 for U.S. Appl. No. 14/473,327, 20 pages.

(Continued)

*Primary Examiner* — Matthew Landau
*Assistant Examiner* — Grant Withers

(57) ABSTRACT

A semiconductor device includes a semiconductor layer disposed at a substrate and a plurality of active cells disposed at the semiconductor layer. Each active cell includes a trench extending into the semiconductor layer and a body region disposed in the semiconductor layer adjacent to a sidewall of the trench and at a first depth below the surface of the semiconductor layer. The semiconductor device further includes a termination cell disposed at the semiconductor layer adjacent to an edge of the plurality of active cells. The termination cell includes a trench extending into the semiconductor layer, and further includes a body region disposed in the semiconductor layer adjacent to a sidewall of the trench of the termination cell and at a second depth less than the first depth. The body regions of the active cells and of the termination cell have a conductivity type different than that of the semiconductor layer.

19 Claims, 16 Drawing Sheets

(56) References Cited

U.S. PATENT DOCUMENTS

| | | | |
|---|---|---|---|
| 6,583,010 B2* | 6/2003 | Mo | H01L 29/7813 257/E21.345 |
| 6,683,363 B2* | 1/2004 | Challa | H01L 21/763 257/328 |
| 7,109,552 B2* | 9/2006 | Wu | H01L 29/7813 257/330 |
| 7,378,317 B2* | 5/2008 | de Fresart | H01L 29/0634 257/135 |
| 7,510,938 B2* | 3/2009 | de Fresart | H01L 29/0634 257/E21.04 |
| 7,855,415 B2 | 12/2010 | Challa et al. | |
| 8,431,989 B2 | 4/2013 | Bhalla et al. | |
| 8,476,133 B2 | 7/2013 | Mo et al. | |
| 2002/0019099 A1* | 2/2002 | Williams | H01L 27/0255 438/270 |
| 2002/0074585 A1 | 6/2002 | Tsang et al. | |
| 2004/0021195 A1* | 2/2004 | Kurosaki | H01L 29/0619 257/506 |
| 2006/0249785 A1* | 11/2006 | Bhalla | H01L 29/402 257/328 |
| 2006/0273385 A1* | 12/2006 | Hshieh | H01L 24/26 257/330 |
| 2006/0273386 A1* | 12/2006 | Yilmaz | H01L 29/7827 257/330 |
| 2007/0114599 A1* | 5/2007 | Hshieh | H01L 29/0634 257/330 |
| 2008/0135931 A1* | 6/2008 | Challa | H01L 21/3065 257/331 |
| 2008/0227269 A1 | 9/2008 | Ma | |
| 2009/0008709 A1 | 1/2009 | Yedinak et al. | |
| 2009/0267689 A1* | 10/2009 | Zupac | H01L 21/8222 330/250 |
| 2010/0084705 A1* | 4/2010 | Radic | H01L 29/42368 257/330 |
| 2010/0140695 A1* | 6/2010 | Yedinak | H01L 29/7397 257/334 |
| 2011/0024806 A1* | 2/2011 | Radic | H01L 29/66734 257/288 |
| 2011/0089483 A1* | 4/2011 | Reynes | H01L 29/0878 257/329 |
| 2011/0204440 A1* | 8/2011 | Bhalla | H01L 29/407 257/333 |
| 2012/0037954 A1* | 2/2012 | Hshieh | H01L 29/0638 257/139 |
| 2013/0187240 A1* | 7/2013 | Takano | H01L 29/66333 257/409 |
| 2013/0307060 A1* | 11/2013 | Wang | H01L 29/42372 257/330 |
| 2013/0344667 A1* | 12/2013 | Qin | H01L 29/7813 438/270 |
| 2014/0231910 A1* | 8/2014 | Willmeroth | H01L 29/0634 257/339 |
| 2014/0374871 A1* | 12/2014 | Hirabayashi | H01L 29/404 257/488 |

OTHER PUBLICATIONS

U.S. Appl. No. 14/473,327, filed Aug. 29, 2014, entitled "Trench Gate FET With Self-Aligned Source Contact".

* cited by examiner

EDGE TERMINATION FOR TRENCH GATE FET

CROSS REFERENCE TO RELATED APPLICATIONS

This application is related to U.S. patent application Ser. No. 14/473,327, entitled "TRENCH GATE FET WITH SELF-ALIGNED SOURCE CONTACT" and filed on even date herewith, the entirety of which is incorporated by reference herein.

BACKGROUND

Field of the Disclosure

The present disclosure relates generally to semiconductor devices and, more particularly, to trench gate field effect transistors.

Description of the Related Art

Trench gate field effect transistors (FETs) frequently are utilized in high-voltage applications. Such transistors often leverage the reduced surface field (RESURF) effect to achieve a relatively low on resistance ($R_{DSon}$) while maintaining a relatively high breakdown voltage ($BV_{dss}$). RESURF-based trench gate architectures employ a one-dimensional or two-dimensional array of cells formed in an active region of an epitaxial layer that overlies a substrate that serves as part of a drain electrode structure. Each cell includes a trench extending into the epitaxial layer, with each trench including a gate electrode structure formed therein. Well regions are formed in the mesa regions of the epitaxial layer between the trenches, and a source electrode is connected to the channel regions via a source contact region. The trench gate design also may employ a termination region at a periphery or one or more edges of the active region so as to provide effective edge termination by spreading out the electric field at the edges of the active region. Conventional trench gate FET designs provide edge termination through the use of field rings or field plates. However, the formation of these structures require a significant number of additional process steps during the fabrication process, thus increasing the cost and complexity of manufacturing semiconductor devices based on these designs.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
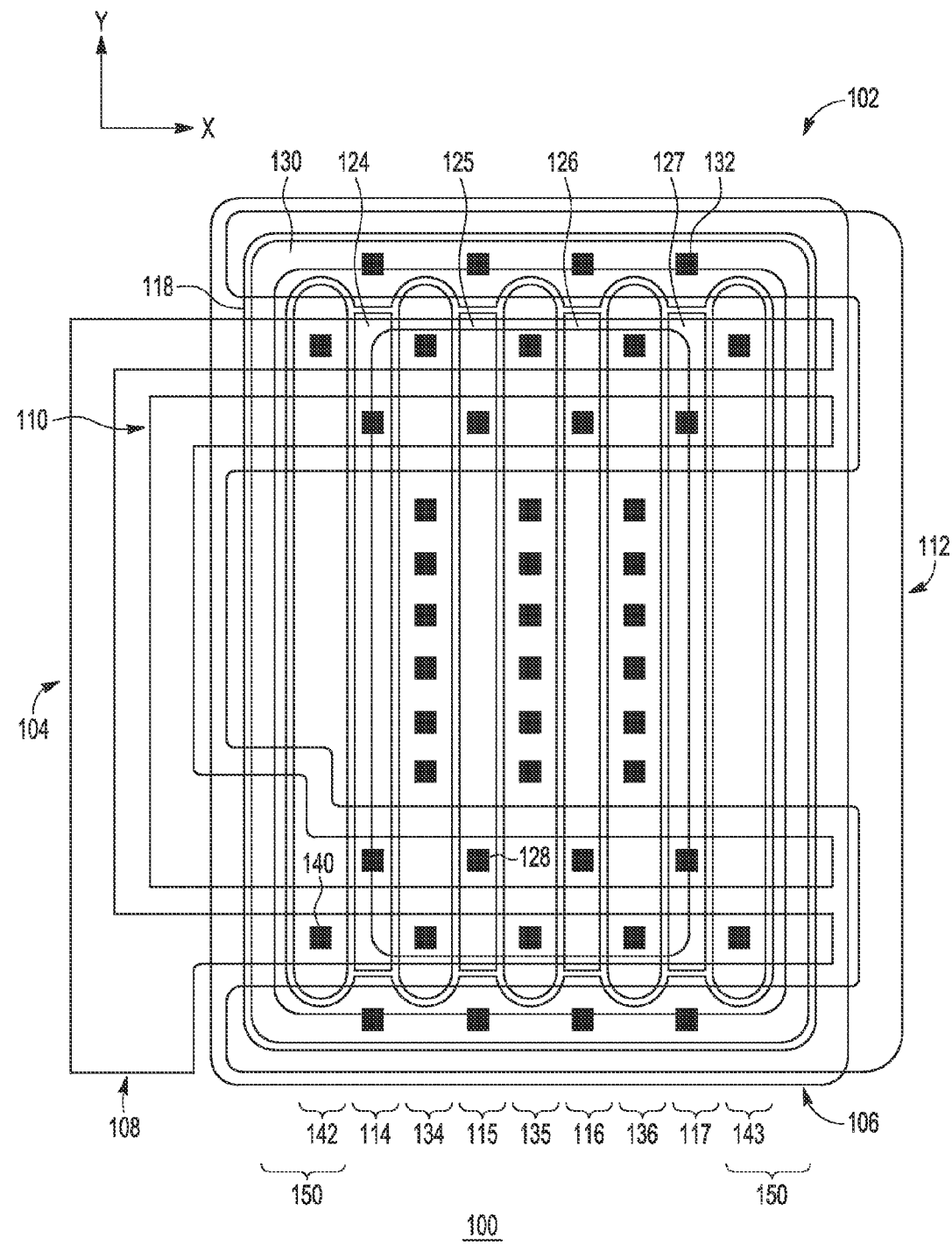
FIG. 1 is a simplified plan view of a semiconductor device employing a trench gate field effect transistor (FET) in accordance with some embodiments.

FIGS. 1-26 illustrate example techniques for fabricating a semiconductor device incorporating a trench gate field effect transistor (FET) with a high-density cell array and effective edge termination. In at least one embodiment, the trench gate FET includes an array of cells formed in an active region of a semiconductor layer of one conductivity type (e.g., N-type) overlying a substrate. Each cell includes a trench extending into the semiconductor layer and a gate electrode and corresponding segment of a shield electrode formed within the trench under a thick top oxide layer (or other insulating material).

In the regions between the trenches (that is, the "mesa regions"), a blanket high-voltage implant process forms buried body regions of another conductivity type (e.g., P-type) below the surface the semiconductor layer, with each buried body region extending between the sidewalls of the trenches adjacent to the corresponding mesa region. A blanket ion implant process forms source contact regions of the same conductivity type as the semiconductor layer (albeit at a higher doping concentration) above the buried body regions in the mesa regions, and separated from the buried body regions by intervening regions of the semiconductor layer. Metallization for a source electrode then may be formed overlying the semiconductor layer and in contact with the source contact regions without the use of contact openings in an intervening dielectric layer formed through the use of a contact mask. As a contact mask is avoided, this approach provides a self-aligned contact between the source contact region and the source electrode metallization. As this approach does not require the use of an N+ implant mask or a contact etch mask as found in the conventional approach to fabricating trench gate FETs, the dimensions of trench gate FETs fabricated in accordance with the teachings herein are not limited to the minimum dimension limits associated with the photolithography design rules use to form such masks. Accordingly, the trenches may be spaced more closely together, and thus take better advantage of the RESURF effect for improved $BV_{dss}$ and $R_{DSon}$ characteristics.

The trench gate FET employing thick trench sidewall oxide and deep trenches in accordance with the designs described herein exhibit improved performance characteristics. However, in some instances, such devices may be susceptible to failure of the RESURF condition at the edge of the device in the event a conventional edge termination structure, such as a junction termination of field plate, is used. Accordingly, the present disclosure also describes example edge termination techniques for trench gate FETs that effectively maintain the RESURF condition at the edge of the device, and which do so in a cost-effective manner that requires few, if any, additional process steps. In at least one embodiment, one or more edge termination structures are formed in a termination cell or other termination region at one or more edges of the array of active cells of the semiconductor device. Each edge termination structure includes a termination cell including a trench extending into the semiconductor layer and a segment of a shield electrode disposed therein. In the mesa region between the trench of the termination cell and the adjacent trench of the active cell at the edge of the active cell array, a body region of an opposite conductivity type than the semiconductor layer is formed in the semiconductor layer at a depth shallower than that of the buried body regions of the active cells. With this configuration, the semiconductor layer material below the body region of the termination structure is thicker than the semiconductor layer material below the body region of the active cells, and thus the edge termination structure has more RESURF area between the trenches than the active cells. As a result, the edge termination structure exhibits a higher $BV_{dss}$ than the active cells, and thus the entire current in the device conducts through the lower BVdss regions represented by the active cells. As the inner cells (i.e., the active cells) have a larger area than the edge cells (i.e., the termination cells), the current density of the inner cells is lower than that of the edge cells, thus preventing the edge cells from being damaged by the higher current density.

Various terms of orientation, such as "above," "below," "bottom," and "top," are used herein to describe spatial relationships between different elements. However, these terms are not intended to imply a particular spatial orientation relative to a gravitational direction or other external fixed reference point, but rather are used in reference to the particular orientation presented in the drawing associated with the corresponding description. Further, the terms "first," "second," "third," and the like are used in the description to distinguish between somewhat similar elements, and is not intended to specify a particular spatial arrangement, sequence, or chronological order unless otherwise noted.

For ease of illustration, examples and embodiments are described in the context of semiconductor devices formed using silicon (Si) as a semiconductor material. However, the techniques described herein are not limited to this context, but instead may employ any of a variety of semiconductor materials, such as SiGe, GaN and Si, SiGe and GaAs, GaAs and Ge, Si and $Si_{1-y}C_y$, SiC and AN, SiC and BP, InGaN, and various other type IV, II-V and II-VI compounds and combinations thereof. Further, for ease of description examples and embodiments are described in the example context of a P-channel device. However, the techniques described herein similarly may be employed for the manufacture and use of N-channel devices. Accordingly, while various semiconductor regions are described herein as being of N-type or P-type in the example context of a P-type trench gate FET device, one of ordinary skill in the art will understand that regions of the opposite conductivity type may be substituted in the context of an N-type trench gate FET device using the teachings provided herein. Likewise, the techniques described herein are not limited to a MOSFET context, but instead may be employed to fabricate any of a variety of transistor devices, as insulated gate bipolar transistor (IGBT) devices and other types of bipolar transistors, using the guidelines provided herein.

FIG. 1 illustrates a simplified plan view of a semiconductor device 100 employing a trench gate metal oxide silicon field effect transistor (MOSFET) 102 in accordance with at least one embodiment. The trench gate FET 102 may be advantageously employed in any of a variety of circuits in which power MOSFETS often are utilized, such as in alternating current (AC)-direct current (DC) converters, DC-DC converters, motor drive controllers, and the like.

In the depicted example, the trench gate FET 102 includes a semiconductor layer 106 overlying a substrate (not shown in FIG. 1) and one or more metallization layers 104 overlying the semiconductor layer 106. The one or more metallization layers 104 form three terminal electrodes for the trench gate FET 102, including a body terminal electrode 108, a gate terminal electrode 110, and a combined source/shield terminal electrode 112, and a drain electrode (not shown in FIG. 1) is formed at the bottom surface of the substrate underlying the semiconductor layer 106. The semiconductor layer 106 includes an array of active trenches, such as active trenches 114, 115, 116, and 117 (collectively, "active trenches 114-117"), encircled by a termination trench 118. As depicted in FIG. 1 and subsequently with reference to FIG. 2, the active trenches 114-117 join the termination trench 118 to form a single larger trench in this embodiment. However, in other embodiments, the active trenches 114-117 and the termination trench 118 may be implemented as separate trenches. As described in greater detail below, each of the active trenches 114-117 includes a separate gate electrode (gate electrodes 124, 125, 126, and 127, respectively) that substantially conforms to the shape of the active trench. Each of the gate electrodes 124, 125, 126, and 127 is conductively connected to the gate terminal electrode 110 via one or more contact plugs 128. A single continuous shield electrode 130 is disposed in the termination trench 118 and underneath the gate electrodes of the active trenches 114-117. The shield electrode 130 is conductively connected to the source/shield terminal electrode 112 via one or more contact plugs 132.

The mesa regions 134, 135, and 136 of the semiconductor layer 106 between the active trenches 114-117 (referred to collectively as "mesa regions 134-136") each includes a source contact region (not shown in FIG. 1) of the same conductivity type (e.g., N-type) formed over a buried body region (not shown in FIG. 1) of the opposite conductivity type (e.g., P-type). The source contact regions and buried body regions extend across the length (Y-axis) of the corresponding mesa region. The buried body regions are conductively connected to the body terminal electrode 108 via body link regions (not shown in FIG. 1) in the semiconductor layer 106 and conductive plugs 140 extending between the body link regions and the body terminal electrode 108. As described in greater detail below, the buried body regions and the source contact regions may be formed through the use of blanket ion implant processes, thereby allowing the source contact regions to act as self-aligned contacts over which the metallization of the source/shield terminal electrode 112 may be directly deposited or otherwise formed.

The mesa region 142 between the termination trench 118 and the active trench 114 and the mesa region 143 between the active trench 117 and the termination trench 118 together form an edge termination structure 150 for the inner, or center, cells formed by the active trenches 114-117 and the mesa regions 134-136. Each of mesa regions 142 and 143 includes a body region (not shown) of the same conductivity type as the buried body regions of the mesa regions 134-136. These body regions extend the length of the mesa regions 142 and 143 and substantially conform to the shapes of the mesa regions 142 and 143. In at least one embodiment, the body regions of the mesa regions 142 and 143 are formed at a shallower depth than the buried body regions of the mesa regions 134-136.

Figure 2:
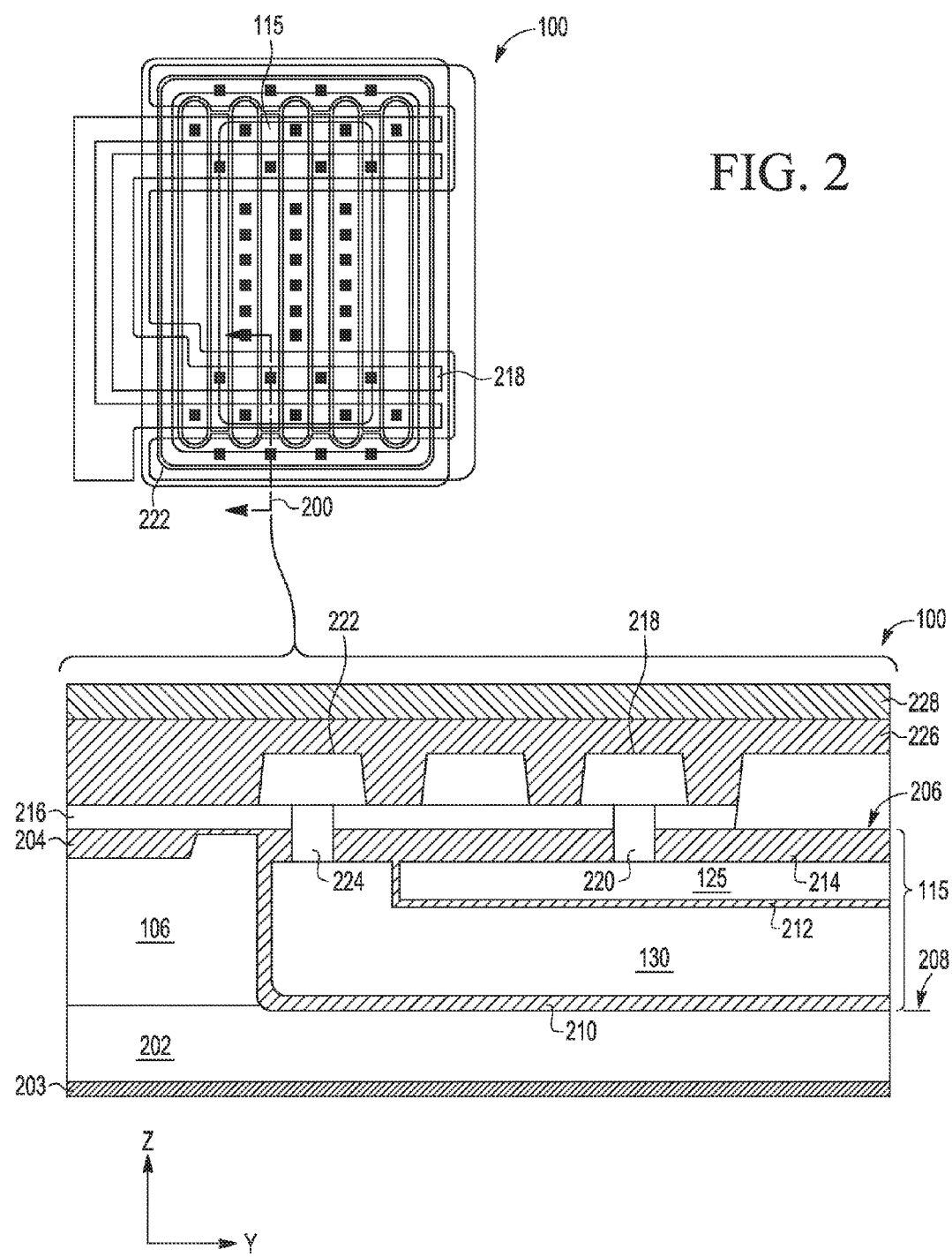
FIG. 2 is a cross-section view of an active trench region of the semiconductor device of FIG. 1 in accordance with some embodiments.

FIG. 2 illustrates a cross-section view of the semiconductor device 100 along cut line 200 aligned with the active trench 115 in accordance with at least one embodiment. The other active trenches 114, 116, and 117 (FIG. 1) are similarly configured in the manner described below. As depicted, the semiconductor device 100 includes a wafer or other substrate 202 over which the semiconductor layer 106 has been grown or otherwise formed. A metallization layer 203 for a drain electrode (not shown) may be formed on the opposite side of the substrate 202. In one embodiment, the substrate 202 includes a heavily-doped N+ silicon arsenide (SiAs) substrate. However, the substrate 202 may be formed of any of a variety of semiconductor materials or combinations thereof, such as gallium arsenide (GaAs), silicon germanium (SiGe), silicon-on-insulator (SOI), silicon (Si), monocrystalline silicon, indium (In), and the like. The semiconductor layer 106 may include a lightly doped N-type epitaxial layer, and thus is also referred to herein as the "epi layer 106." However, the combination of a highly doped layer surmounted by a layer of substantially uniform light doping as represented by the substrate 202 and the semiconductor layer 106 may be achieved in other ways known in the art.

In the region represented by the cross-section view of FIG. 2, the epi layer 106 includes a shallow trench isolation (STI) region 204 and the trench 115. The shallow trench isolation region 204 may be formed by etching a shallow trench at the perimeter of the active area of the trench gate FET 102 and depositing or otherwise forming $SiO_2$ or other suitable insulating material in the shallow trench. The trench 115 extends into the epi layer 106 from a surface 206 of the epi layer 106 (hereinafter, "semiconductor surface 206") to a depth 208. As illustrated in FIG. 2, the trench 115 may extend into the substrate 202. The trench 115 includes a shielded gate structure insulated from the sidewalls and bottom of the trench 115 by one or more layers of oxide or other suitable insulating material. This shielded gate structure includes the gate electrode 125 above a corresponding segment of the shield electrode 130. The gate electrode 125 and shield electrode 130 may be formed from polysilicon or any of a variety of other suitable electrode materials. The shield electrode 130 is insulated from the bottom of the trench 115 by a thick bottom oxide layer 210 included of $SiO_2$ (on the basis of TEOS) or other suitable dielectric material. The gate electrode 125 is insulated from the shield electrode 130 by an inter-poly dielectric layer 212. A thick top oxide layer 214 of $SiO_2$ (on the basis of TEOS) or other suitable dielectric material extends from the top surfaces of the gate electrode 125 and the shield electrode 130 to the semiconductor surface 206.

The epi layer 106 and the structures formed therein are insulated from the metallization forming the electrodes 108 and 110 (FIG. 1) by a top dielectric layer 216 formed overlying the semiconductor surface 206. In the cross-section view of FIG. 2, a node 218 of the gate terminal electrode 110 is conductively connected to the trench gate electrode 125 using a conductive contact plug 220 formed of tungsten (W) or another suitable conformal conductive materials in corresponding contact openings formed in the top dielectric layer 216 and the top oxide layer 214 between the node 218 and the trench gate electrode 125. Similarly, a node 222 of the source/shield terminal electrode 112 is conductively connected to the shield electrode 130 using a conductive contact plug 224 formed in corresponding contact openings in the top dielectric layer 216 and the top oxide layer 214. A passivation layer 226 and a polyimide layer 228 are formed overlying the metallization forming the electrodes 108-112.

Figure 3:
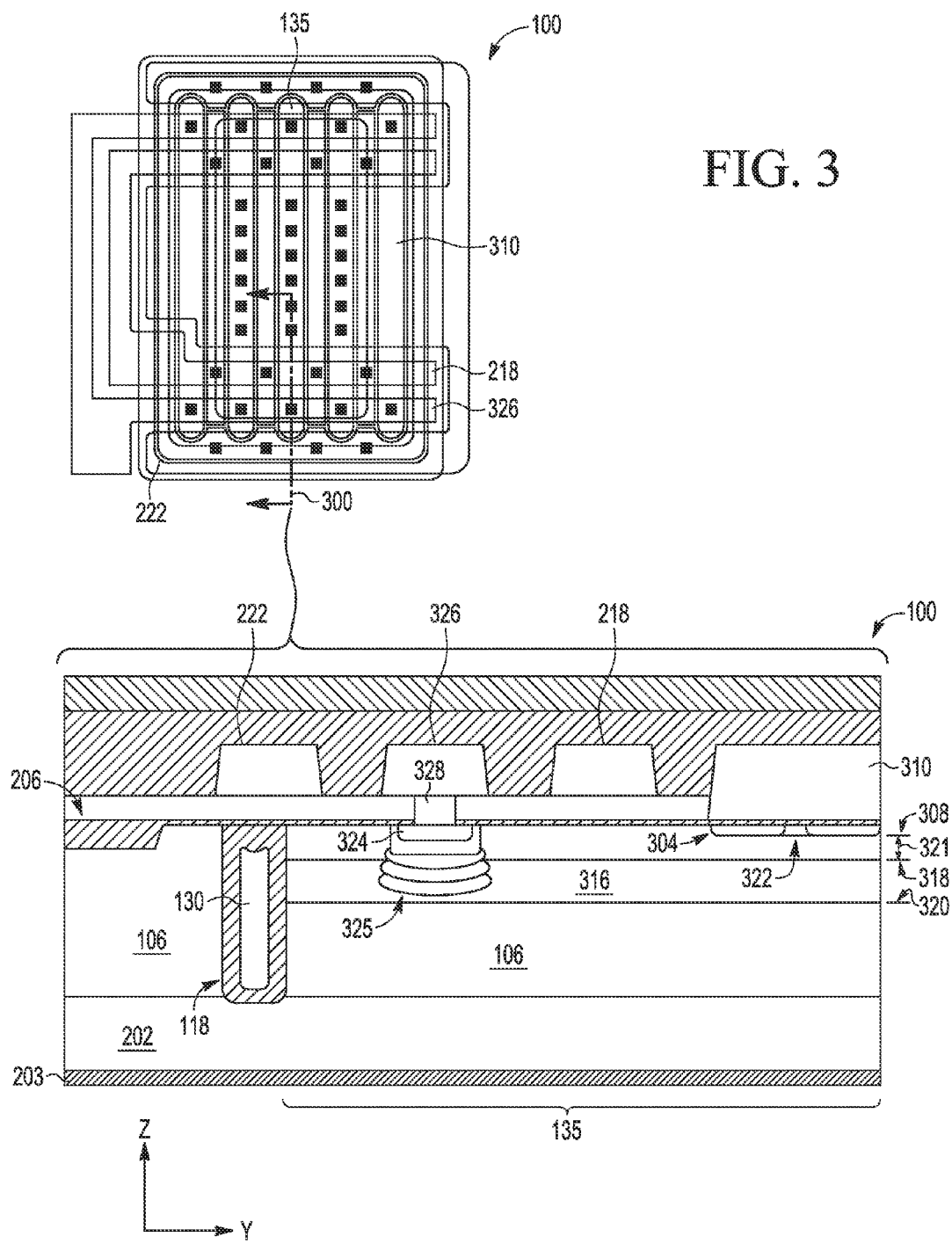
FIG. 3 is a cross-section view of an active mesa region of the semiconductor device of FIG. 1 in accordance with some embodiments.

FIG. 3 illustrates a cross-section view of the semiconductor device 100 along cut line 300 aligned with the mesa region 135 in accordance with at least one embodiment. The other mesa regions 134 and 136 are similarly configured in the manner described below. As depicted, the termination trench 118, which defines the lateral extent of the mesa region 134, includes the shield electrode 130 extending substantially perpendicular to the long axis of the mesa region 135 and insulated from the epi layer 106 by a bottom oxide layer, a top oxide layer, and sidewall oxide layers formed between the shield electrode 130 and the sidewalls of the termination trench 118.

The mesa region 135 includes an N+ source contact region 304 formed at the semiconductor surface 206 and extending to a depth 308 in the epi layer 106. The source contact region 304 is in conductive contact with a node 310 of the source/shield terminal electrode 112. As described in greater detail below with reference to FIGS. 17-19, the source contact regions may be formed using a blanket ion implant process and the metallization forming the node 310 of the source/shield electrode 112 (FIG. 1) may be formed directly in contact with the source contact regions 304 and 306, thereby providing self-aligned contacts between source contact regions and the source/shield terminal electrode 112.

The mesa region 135 further includes a P-type buried body region 316 that extends the length of the mesa region 135. The buried body region 316 is "buried" in that it is formed at a non-zero depth below the semiconductor surface 206, extending from an upper depth 318 to a lower depth 320 of the epi layer 106. The upper depth 318 is deeper into the epi layer 106 than the depth 308 of the source contact regions 304 and 306 such that the source contact regions 304 and 306 are separated from the buried body region 316 by a region 322 of the epi layer 106. A P+ body contact region 324 is formed at the semiconductor surface 206 at or below a node 326 of the body terminal electrode 108 and the body contact region 324 is conductively connected to the node 326 using a conductive plug 328 formed in a contact opening in the top dielectric layer 216. The buried body region 316 in turn is connected to the body contact region 324, and thus the body terminal electrode 108, by a P-doped body link region 325 formed between the buried body region 316 and the body contact region 324. As described in greater detail below, the body link region 325 may be formed using a chained ion implant process, whereby a series of ion implant processes at different implant energies is performed to form a chain of overlapping P-doped regions that extend from the body contact region 324 to the buried body region 316.

Figure 4:
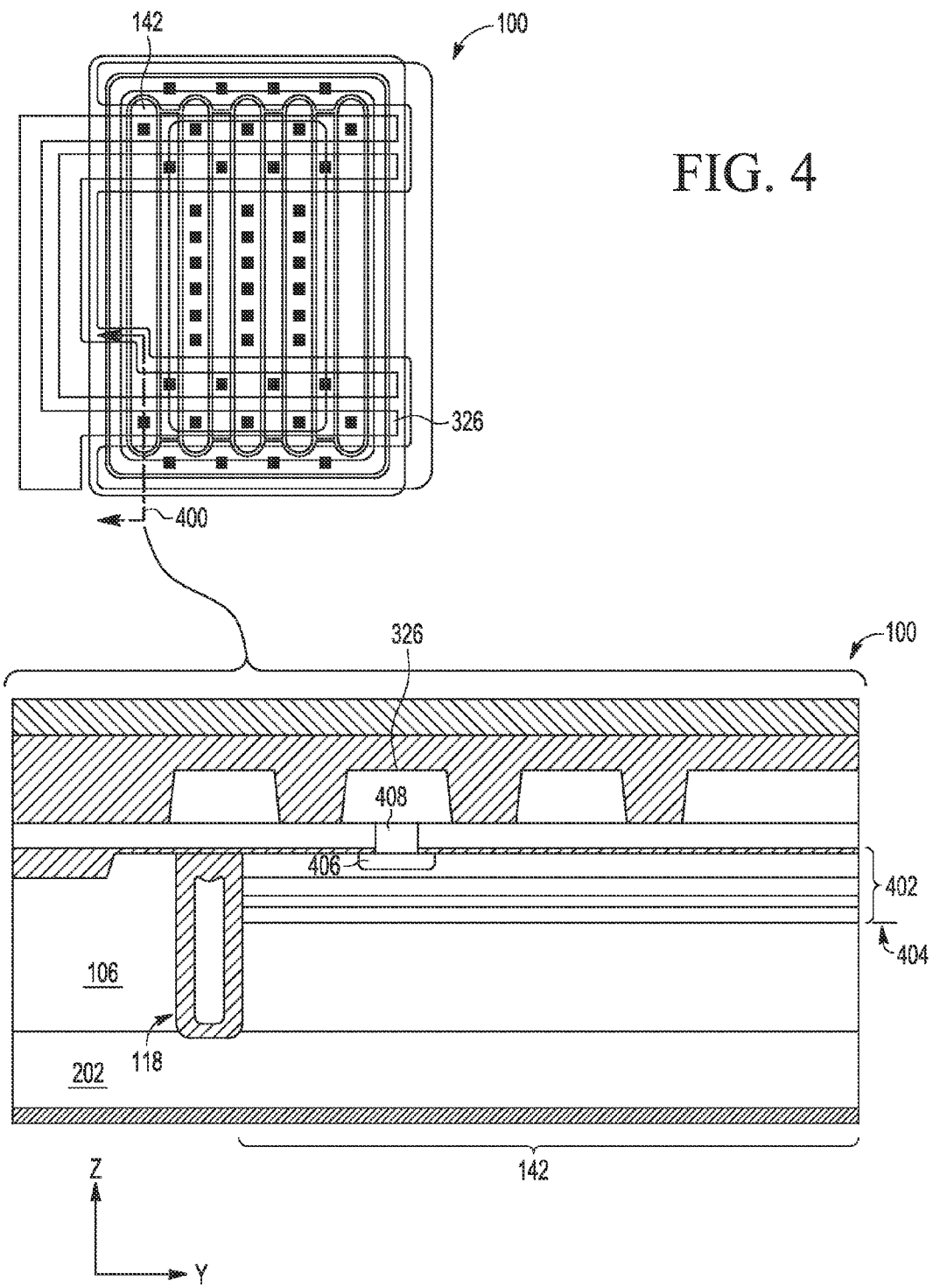
FIG. 4 is a cross-section view of a termination mesa region of the semiconductor device of FIG. 1 in accordance with some embodiments.

FIG. 4 illustrates a cross-section view of the semiconductor device 100 along cut line 400 aligned with the mesa region 142 of the termination cell in accordance with at least one embodiment. The mesa region 143 is similarly configured in the manner described below. As depicted, the mesa region 142 includes a body link region 402 formed in the epi layer 106 and extending the lateral extent of the mesa region 142, which is defined by the trench 118. As with the body link region 325 of FIG. 3, the body link region 402 may be formed using a chained ion implant process so as to form a series of overlapping P-doped regions that extends from a depth 404 to the semiconductor surface 206. In the cross-section view represented by FIG. 4, the body link region 402 is connected to the node 326 of the body terminal electrode 108 via a P+ body contact region 406 formed at the semiconductor surface 206 of the epi layer 106 and a conductive plug 408 formed in a contact opening between the node 326 and the body contact region 406.

Figure 5:
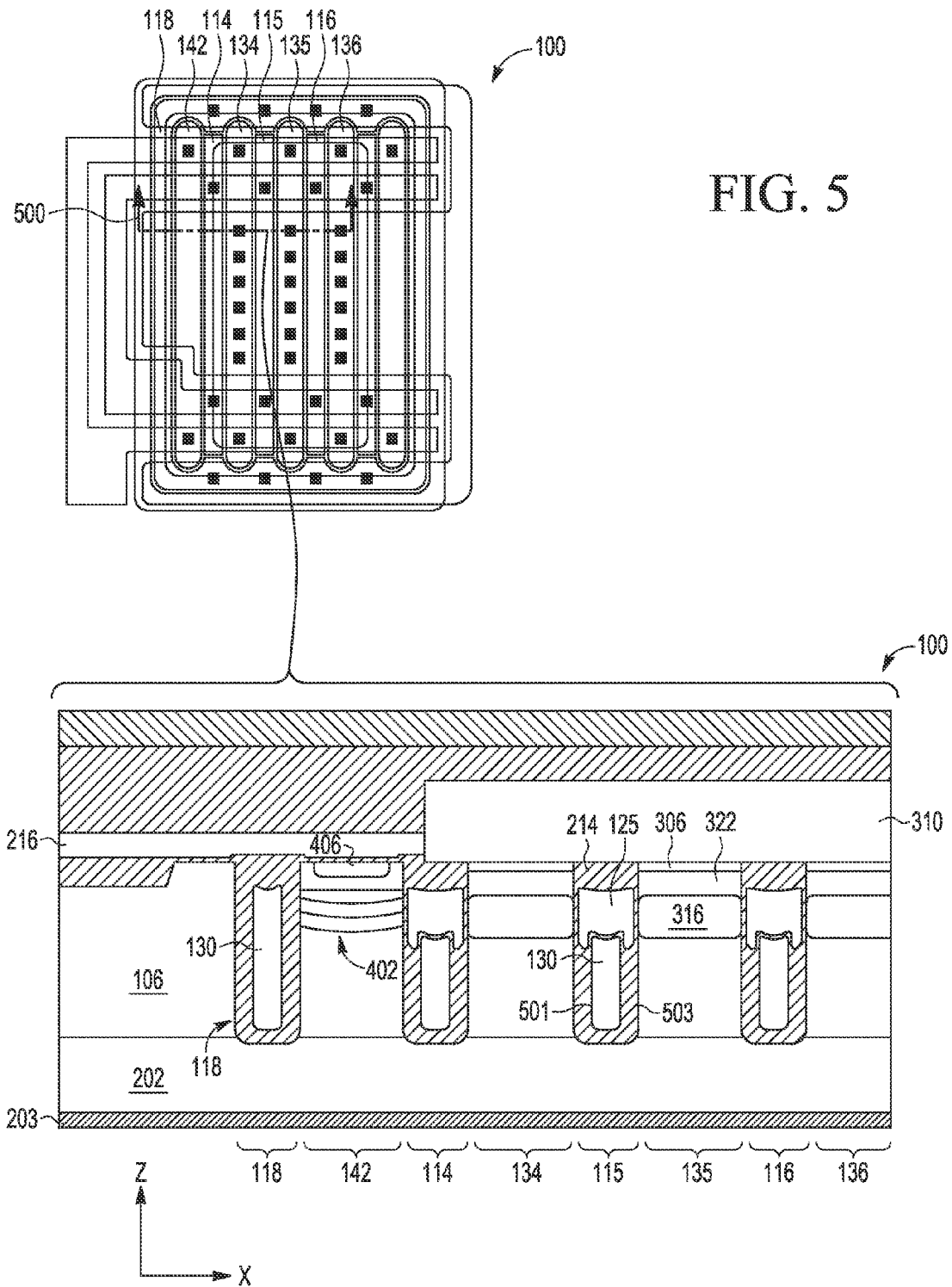
FIG. 5 is a cross-section view of a termination cell and a plurality of active cells below a source electrode metallization of the semiconductor device of FIG. 1 in accordance with some embodiments.

FIG. 5 illustrates a cross-section view of the semiconductor device 100 along cut line 500 extending across the termination trench 118, the mesa regions 142, 134, 135, and 136, and the active trenches 114, 115, and 116. As shown, in this cross-section the shield electrode 130 has segments that extend along the trench 118 and underneath the trench gate electrodes (e.g., trench gate electrode 125) of the active trenches 114, 115, and 116. The sides of the trench gate electrodes and the sides of the portions of the shield electrode 130 in the trenches 114, 115, and 116 are insulated from the epi layer 106 by side oxide layers, such as side oxide layers 501 and 503 for the trench 115, and the area of the trench above the trench gate electrode is filled with a thick oxide layer, such as top oxide layer 214 above trench gate electrode 125 in trench 115. The mesa region 142 includes the body link region 402 extending from the sidewall of the trench 118 defining one edge of the mesa region 142 to the adjacent sidewall of the active trench 114 defining the other edge of the mesa region 142, as well as the body contact region 406 formed in the body link region 402. Each of the mesa regions 134, 135, and 136 includes a buried body region and a source contact region extending between the sidewalls of adjacent trenches and separated by a corresponding region of the epi layer 106, such as the buried body region 316 separated from the source contact region 306 by region 322 of the epi layer 106 in the mesa region 135. The source contact regions in turn are in direct contact with the metallization forming the node 310 of the source/shield terminal electrode 112.

Figure 6:
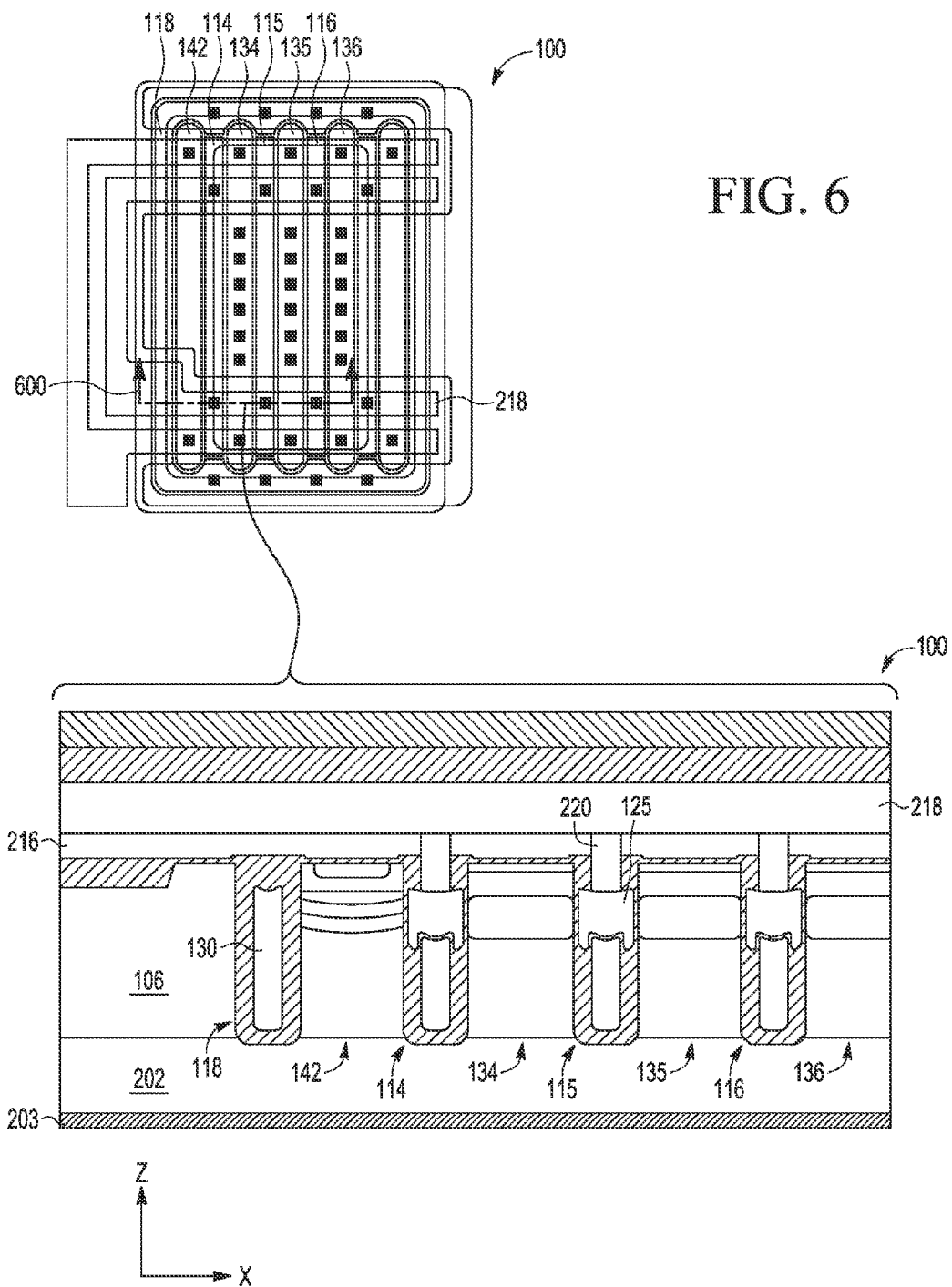
FIG. 6 is a cross-section view of the termination cell and the plurality of active cells below a gate electrode metallization of the semiconductor device of FIG. 1 in accordance with some embodiments.

FIG. 6 illustrates a cross-section view of the semiconductor device 100 along cut line 600 extending across the termination trench 118, the mesa regions 142, 134, 135, and 136, and the active trenches 114, 115, and 116. As shown, in this cross-section the trench gate electrodes are conductively connected to the node 218 of the gate terminal electrode 110 via conductive plugs formed in corresponding contact openings, such as the conductive plug 220 connecting the trench gate electrode 125 of the active trench 115 with the metallization forming the node 218.

Figure 7:
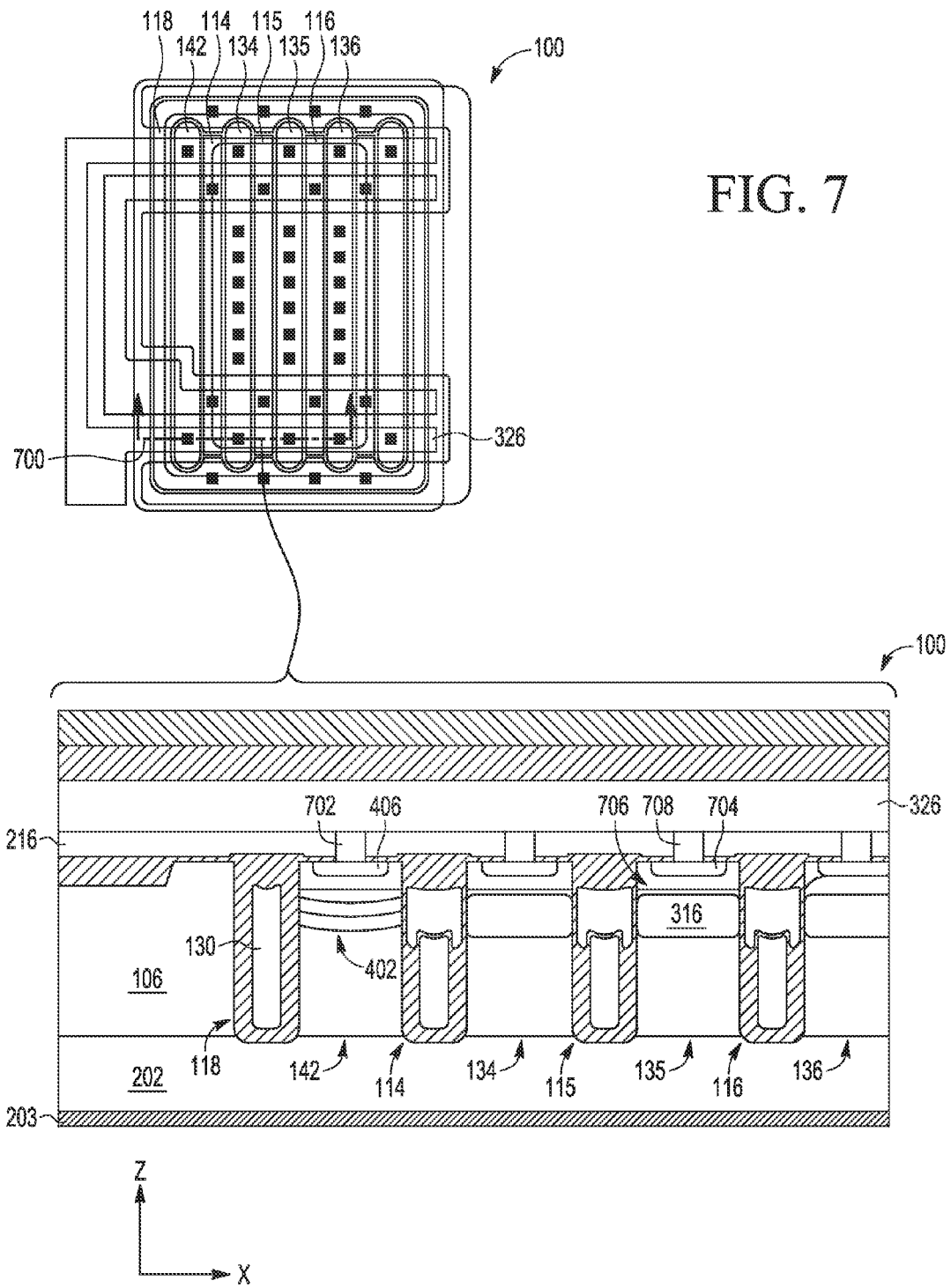
FIG. 7 is a cross-section view of the termination cell and the plurality of active cells below a body electrode metallization of the semiconductor device of FIG. 1 in accordance with some embodiments.

FIG. 7 illustrates a cross-section view of the semiconductor device 100 along cut line 700 extending across the termination trench 118, the mesa regions 142, 134, 135, and 136, and the active trenches 114, 115, and 116. As described above with reference to the cross-section view 500 of FIG. 5, the mesa region 142 includes a body contact region 406 formed in a body link region 402. A conductive plug 702 conductively connects the body contact region 406 and the body link region 402 to the node 326 of the body terminal electrode 108. Similarly, body link regions and body contact regions are formed in each of the mesa regions 134, 135, and 136, with each body link region extending from the semiconductor surface 206 into the buried body region within the corresponding mesa region, and with each body contact region being conductively connected to the node 326 of the body terminal electrode 108 via a corresponding conductive plug. For example, the active trench 115 includes a body link region 706 extending from the semiconductor surface 206 into the body region 316 in the mesa region 135 and a body contact region 704 formed therein. The body contact region 704 in turn is connected to the node 326 of the body terminal electrode 108 using a conductive plug 708 formed in a contact opening in the top dielectric layer 216.

Figure 8:
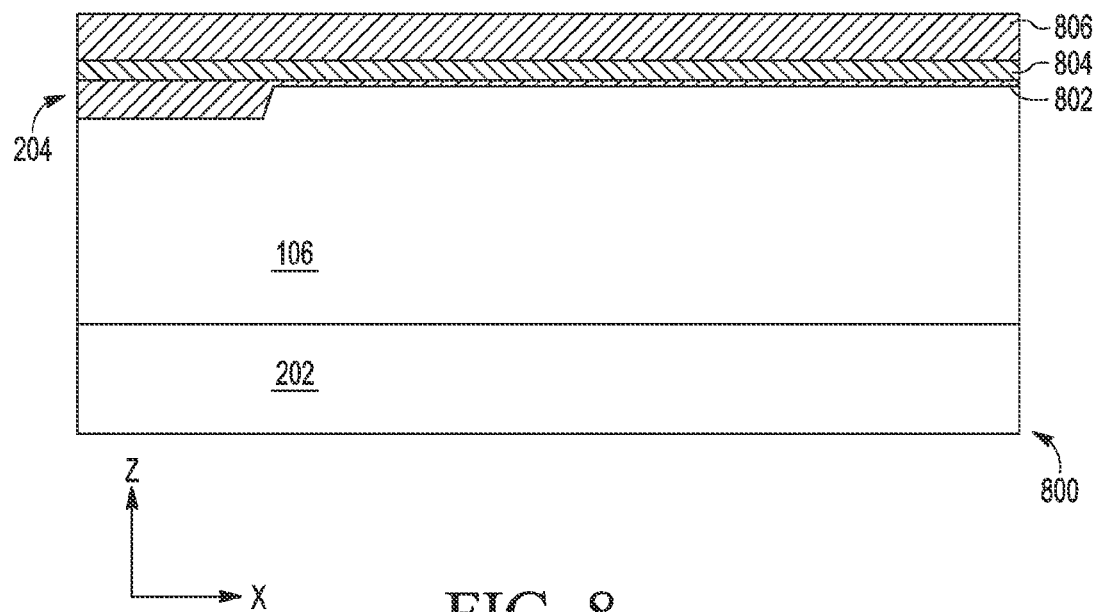
FIG. 8 is a cross-section view of a workpiece during an initial manufacturing stage in accordance with some embodiments.

FIGS. 8-18 together illustrate various manufacturing stages of an example manufacturing process for fabricating the semiconductor device 100 from a workpiece in accordance with at least one embodiment of the present disclosure. FIG. 8 illustrates a cross-section view of a workpiece 800 at a cut line corresponding to cut line 400 of FIG. 4 at an initial manufacturing stage. The workpiece 800 is provided with the epi layer 106 grown or otherwise formed over the substrate 202. The substrate 202 may include, for example, an N++ As doped Si layer with a <100> crystal orientation. The epi layer 106 may include, for example, an N-doped Si layer approximately 5 micrometers (um) thick with As as the dopant at a doping concentration of between 3.5E16-4.5E16 atoms/square centimeter. At the illustrated manufacturing stage, the STI region 204 has been formed and a pad oxide layer 802, a pad nitride layer 804, and a trench hard mask layer 806 have been formed overlying the semiconductor surface 206 using a sequence of growth, deposition, etch, and clean processes.

Figure 9:
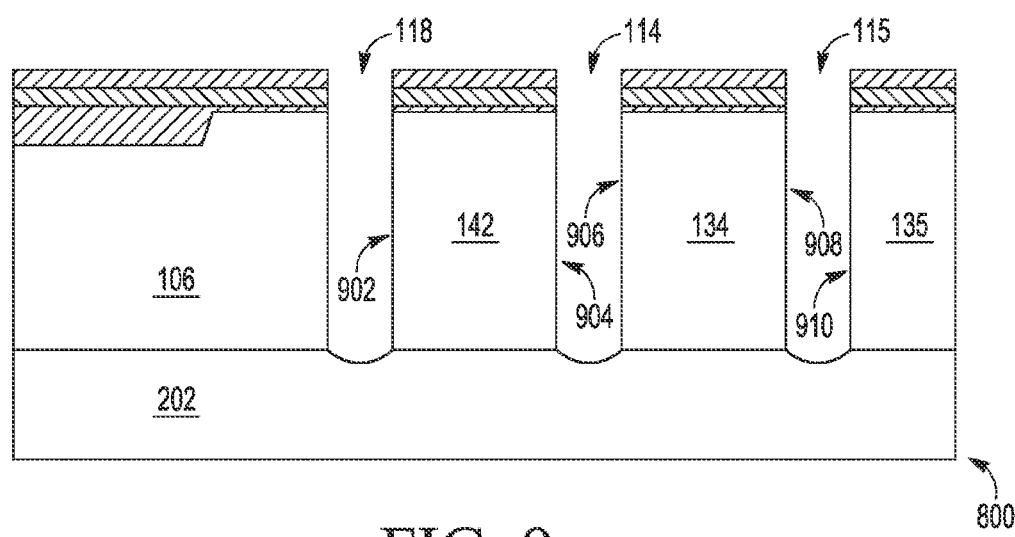
FIG. 9 is a cross-section view of the workpiece after formation of trenches in a semiconductor layer in accordance with some embodiments.

FIG. 9 illustrates a cross-section view of the workpiece 800 at a subsequent manufacturing stage. At this stage, the trenches 118, 114, and 115 have been formed in the epi layer 106 through a series of etch processes. The sidewall 902 of the termination trench 118 and the adjacent sidewall 904 of the active trench 114 define the lateral extent of the mesa region 142. The sidewall 906 of the active trench 114 and the adjacent sidewall 908 of the active trench 115 define the lateral extent of the mesa region 134. The sidewall 910 of the active trench 115 and the adjacent sidewall of the trench 116 (not shown in FIG. 9) define the lateral extent of the mesa region 135.

Figure 10:
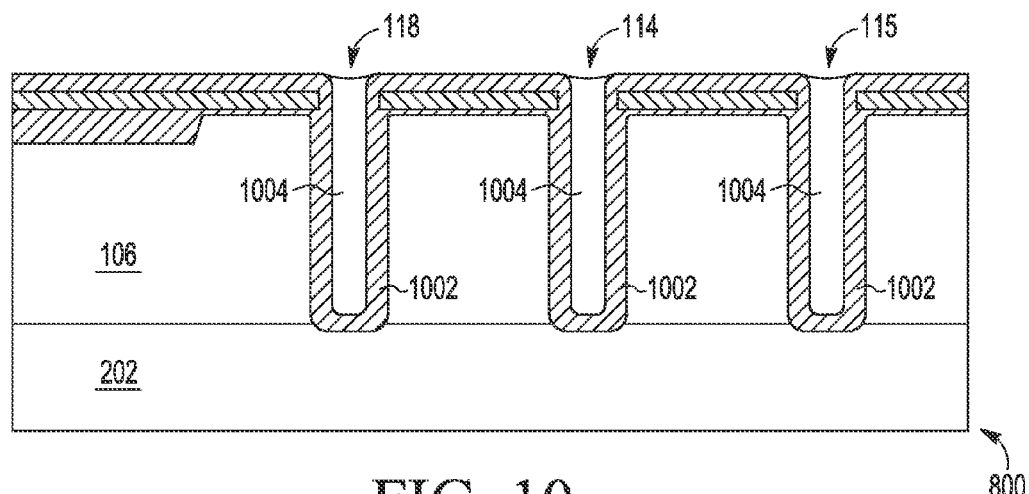
FIG. 10 is a cross-section view of the workpiece after a bottom oxide fill of the trenches in accordance with some embodiments.

As shown by the manufacturing stage represented by FIG. 10, a conformal thick oxide layer 1002 of $SiO_2$ (on the basis of TEOS) or other suitable material has been deposited along the bottoms and sidewalls of the trenches, thereby forming the bottom oxide layers (e.g., bottom oxide layer 210 of FIG. 2) and side oxide layers (e.g., side oxide layers 501 and 503 of FIG. 5). The trenches 118, 114, and 115 then are filed with in-situ doped polysilicon material 1004 above the thick oxide layer 1002, and the polysilicon material 1004 is leveled to the tops of the trenches 118, 114, and 115 through chemical-mechanical planarization (CMP) or another planarization process.

Figure 11:
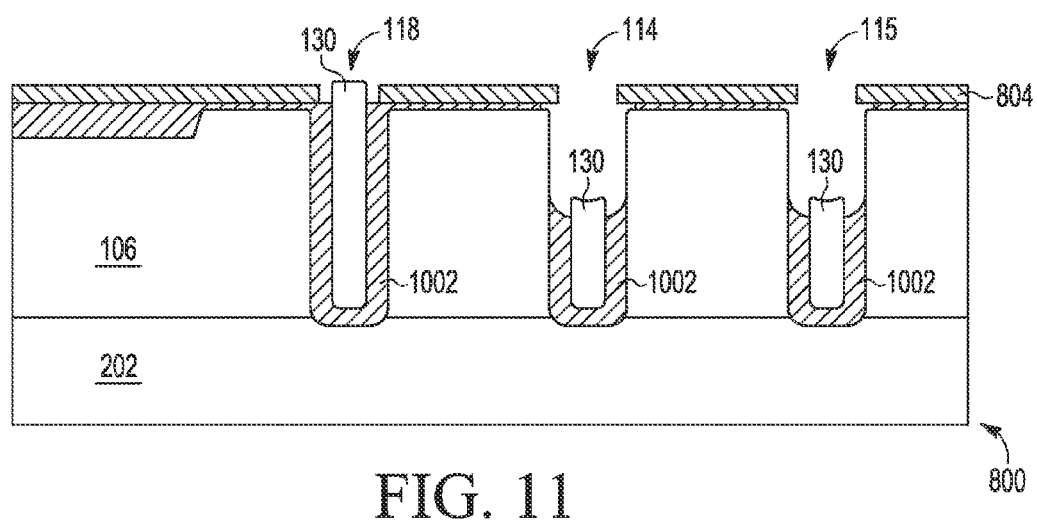
FIG. 11 is a cross-section view of the workpiece after formation of segments of a shield electrode in the trenches in accordance with some embodiments.

At the manufacturing stage represented by FIG. 11, the thick oxide layer 1002 has been etched or otherwise removed where it overlaid the pad nitride layer 804 and both the thick oxide layer 1002 and the polysilicon material 1004 have been partially etched or otherwise partially removed from the active trenches 114 and 115, leaving in each trench a portion of the polysilicon material that will become the corresponding segment of the shield electrode 130 and a portion of the thick oxide layer 1002 to insulate the sides and bottoms of these segments of the shield electrode 130 from the epi layer 106. The portions of the polysilicon material 1004 and the thick oxide layer 1002 formed in the termination trench 118 are maintained through the use of etch masks during the etching of the structures in the active trenches 114 and 115, thereby forming the segment of the shield electrode 130 positioned in the termination trench 118, as previously depicted in FIG. 5.

Figure 12:
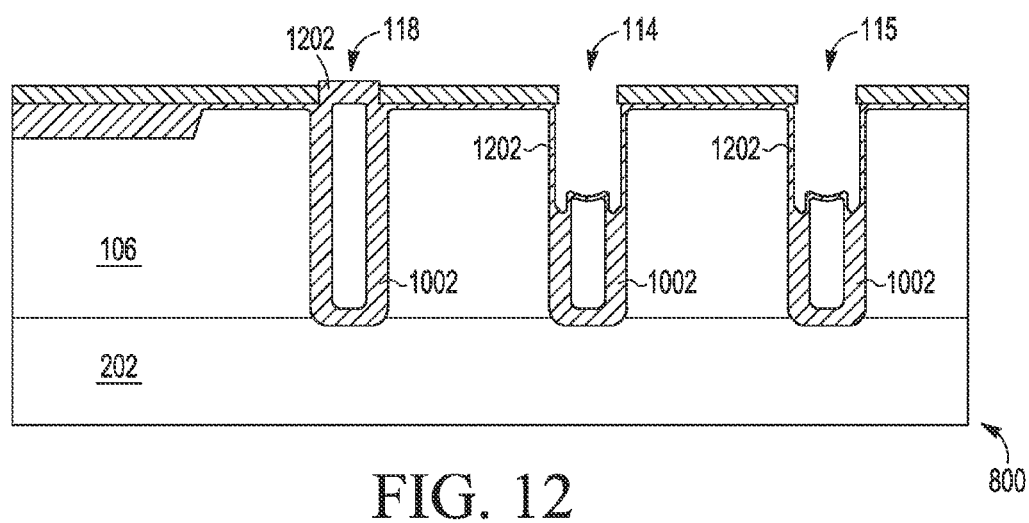
FIG. 12 is a cross-section view of the workpiece after fabrication of an inter-poly dielectric layer in the trenches in accordance with some embodiments.
Figure 13:
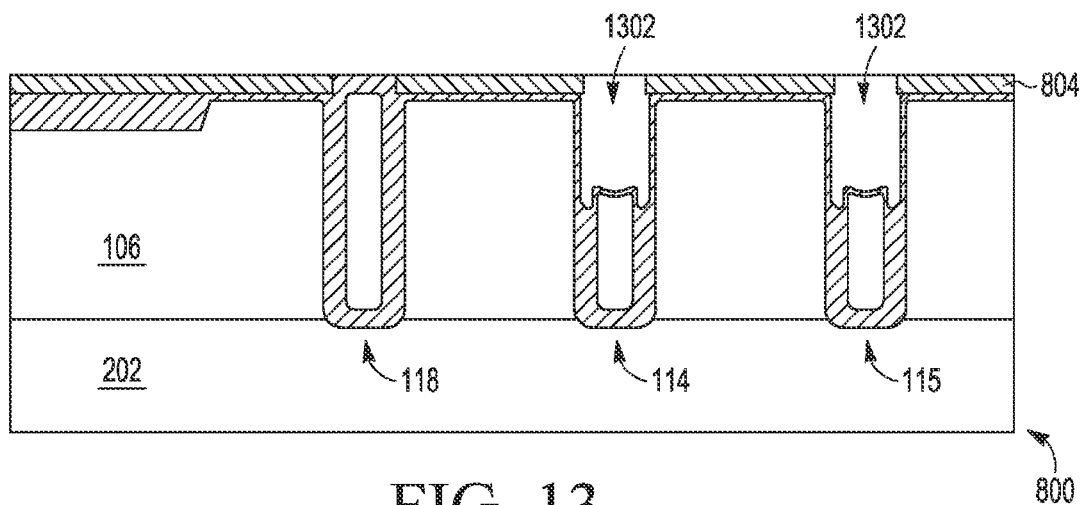
FIG. 13 is a cross-section view of the workpiece after a top oxide fill of the trenches in accordance with some embodiments.

At the manufacturing stage represented by FIG. 12, a thin oxide layer 1202 is grown or otherwise formed in the trenches 118, 114, and 115 over the top surfaces of the shield electrode segments in the trenches 118, 114, and 115 and the remaining oxide, thereby forming the inter-poly dielectric layer 212 (FIG. 2). In FIG. 13, the remainder of the trenches 114 and 115 are filed with in-situ doped polysilicon material 1302 and planarized to the surface of the pad nitride layer 804.

Figure 14:
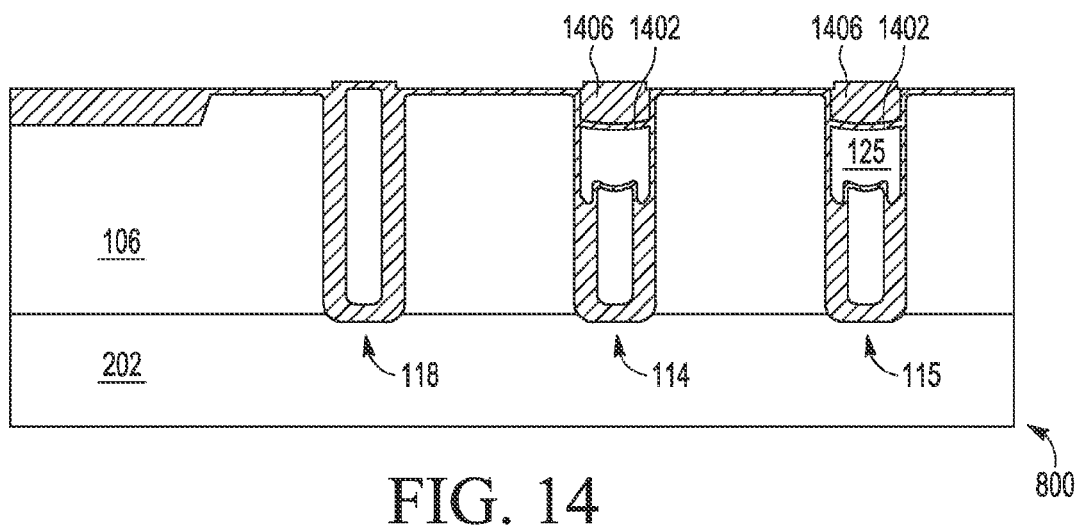
FIG. 14 is a cross-section view of the workpiece after formation of gate electrodes in the trenches in accordance with some embodiments.

At the manufacturing stage represented by FIG. 14, a portion of the polysilicon material 1302 is removed from each of the trenches through an etch process, with the remaining polysilicon material 1302 forming the trench gate electrodes (e.g., trench gate electrode 125) of the trenches 114 and 115. A reoxidation process is performed to form a thin oxide layer 1402 on the top surfaces of the trench gate electrodes, and then a conformal thick layer of $SiO_2$ or other suitable oxide is formed in the remainder of the trenches 114 and 115 and overlying the pad nitride layer 804 (FIG. 13).

The oxide layer is planarized to the surface of the pad nitride layer 804 and then the pad nitride layer 804 is stripped from the workpiece 800, leaving thick top oxide layers 1406 above the trench gate electrodes in the trenches 114 and 115, respectively. As one example, the thin oxide layer 1402 may be formed at a thickness of approximately 0.08 um, whereas the thick top oxide layers 1404 and 1406 may be formed at thicknesses between 0.1-2.0 micrometers (um), and preferably between 0.5 and 1.0 um.

Figure 15:
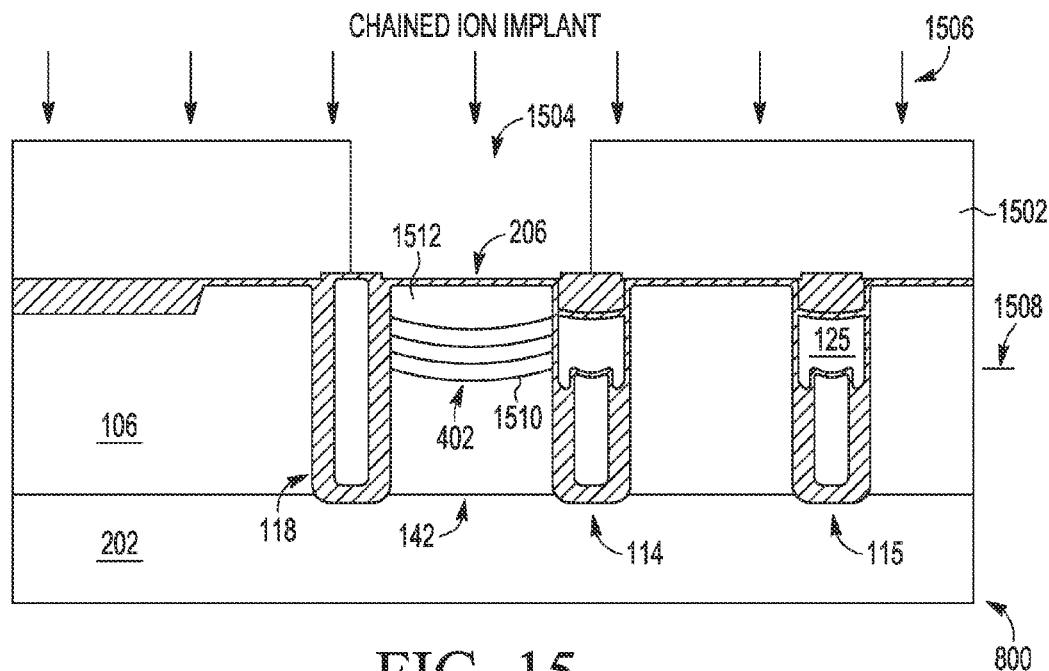
FIG. 15 is a cross-section view of the workpiece during a chained ion implant process for forming a peripheral body link region in accordance with some embodiments.

FIG. 15 illustrates a manufacturing stage for formation of the body link region 402 in the mesa region 142. To protect areas of the workpiece 800 not intended for implantation, an implant mask layer 1502 included of photoresist or other suitable material is deposited or otherwise formed overlying the semiconductor surface 206 and an opening 1504 in the implant mask layer 1502 is formed in the area overlying the mesa region 142. In at least one embodiment, the body link region 402 and other body link regions of the workpiece 800 are formed through a chained ion implant process 1506 in which a series of ion implants at different implant energies are performed to form a chain of overlapping P-doped regions extending from the semiconductor surface 206 to a depth 1508 in the N-doped epi layer 106. To illustrate, the chained implant process 1506 includes an ion implant using boron at a dose of approximately 2.0E14 atoms per square centimeter ("sq. cm") at an implant energy of approximately 320 keV to form a bottom doped region 1510 extending to the depth 1508 followed by an ion implant using boron at a dose of approximately 2.0E15 atoms per sq. cm at an implant energy of approximately 80 keV to form a top doped region 1512 extending from the semiconductor surface 206 and overlapping with an upper extent of the bottom doped region 1510. In other embodiments, the chain implant process 1506 may implement a series of three or more ion implants, and the series may sequence from higher implant energy to lower implant energy, or vice versa, or any order of different implant energies. As noted, the other body link regions, such as the body link region 325 of FIG. 3, may be formed from the same chained ion implant process 1506 or from one or more similar chained ion implant processes.

Figure 16:
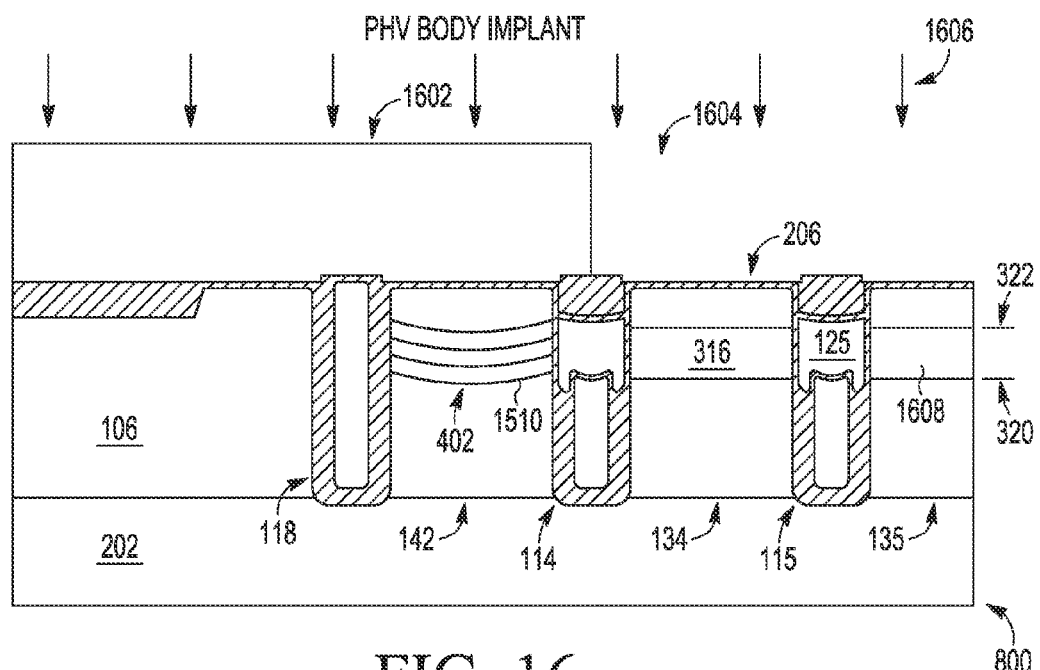
FIG. 16 is a cross-section view of the workpiece during a high-voltage ion implant process for forming buried body regions between the trenches in accordance with some embodiments.

FIG. 16 illustrates a manufacturing stage for formation of the body regions in the mesa regions 134 and 135. To protect perimeter areas of the workpiece 800 not intended for implantation at this stage, an implant mask layer 1602 included of photoresist or other suitable material is deposited or otherwise formed overlying the semiconductor surface 206 and an opening 1604 in the implant mask layer 1502 is formed in the area overlying the inner cells. A P-type high voltage (PHV) implant process 1606 then is performed to form the buried body region 316 in the mesa region 134 and a buried body region 1608 in the mesa region 135. A blanket PHV implant process may be implemented at this stage due to the screen oxide function provided by the thick top oxide layers formed at the tops of the trenches in the inner cells. To illustrate, the PHV implant process 1606 may include a P-type blanked implant using boron at a dose of approximately 2.0E13 atoms per sq. cm at an implant energy between 750 and 950 keV, and preferably at about 850 keV, to form the buried body regions 316 and 1608 between depths 320 and 321 below the semiconductor surface 206. The PHV implant process 1606 may be followed by, for example, a furnace anneal process at, for example, at a temperature of 1050 degrees centigrade to redistribute the dopants of the body regions and body link regions of the workpiece 800.

Figure 17:
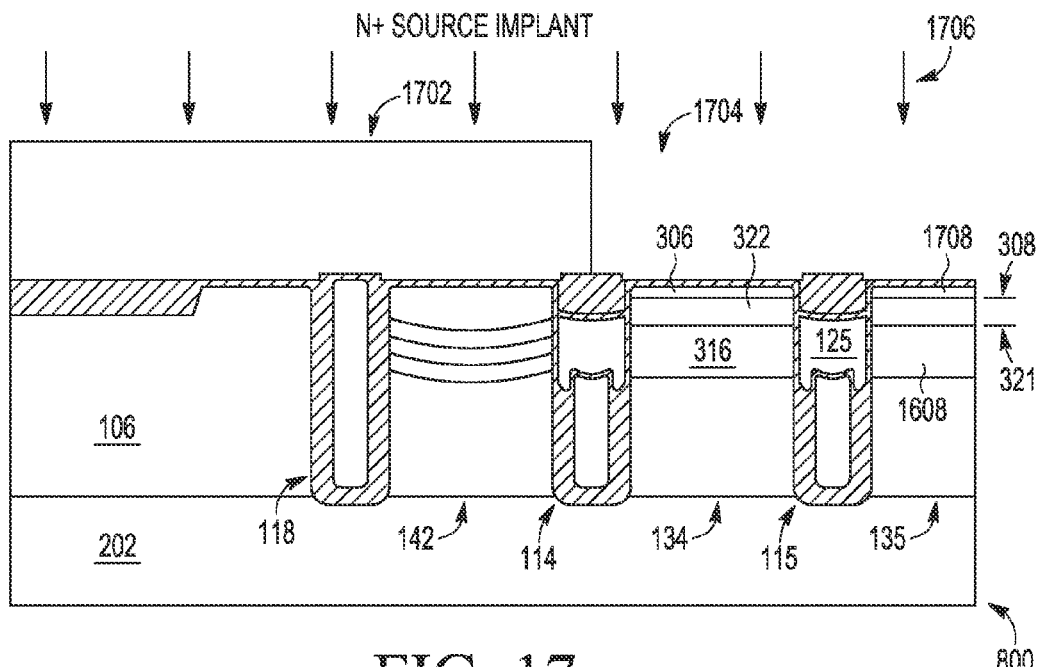
FIG. 17 is a cross-section view of the workpiece during an ion implant process for forming self-aligned source contact regions above the buried body regions in accordance with some embodiments.

FIG. 17 illustrates a manufacturing stage for formation of the source regions in the mesa regions 134 and 135 of the workpiece 800. To protect perimeter areas of the workpiece 800 not intended for implantation at this stage, an implant mask layer 1702 included of photoresist or other suitable material is deposited or otherwise formed overlying the semiconductor surface 206 and an opening 1704 in the implant mask layer 1702 is formed in the area overlying the inner cells. An N+ implant process 1706 then is performed to form the source contact region 306 above the body region 316 in the mesa region 134 and to form a source contact region 1708 above the body region 1608 in the mesa region 135. The N+ implant process 1706 may be followed by a furnace anneal process at a temperature of, for example, 900 degrees centigrade to redistribute the dopants of the source contact regions of the workpiece 800.

As with the PHV implant process 1606, the N+ implant process 1706 may be performed as a blanket implant process for the inner cell region due to the implant protection afforded by the thick oxide layers (acting in effect as screen oxide layers) at the tops of the trenches in the inner cell region. To illustrate, the N+ implant process 1706 may include a blanket N-type implant using arsenic (As) at a dose of approximately 6.0E15 atoms per sq. cm an implant energy between 50 and 100 keV, and preferably at about 80 keV. The source contact regions 306 and 1708 extend approximately to a depth 308 that is shallower than the upper depth 321 of the body regions 316 and 1608, and thus the source contact region 306 is separated from the body region 316 by a region 322 of the epi layer 106 and the source contact region 1708 is separated from the body region 1608 by a region 1710 of the epi layer 160. Moreover, the resulting source contact regions extend fully between the sidewalls of the adjacent trenches that define the mesa region in which the source contact region is formed. As such, the N+ implant process 1706, in combination with the particular structure of the workpiece 800, provide for self-aligned source contact regions.

Figure 18:
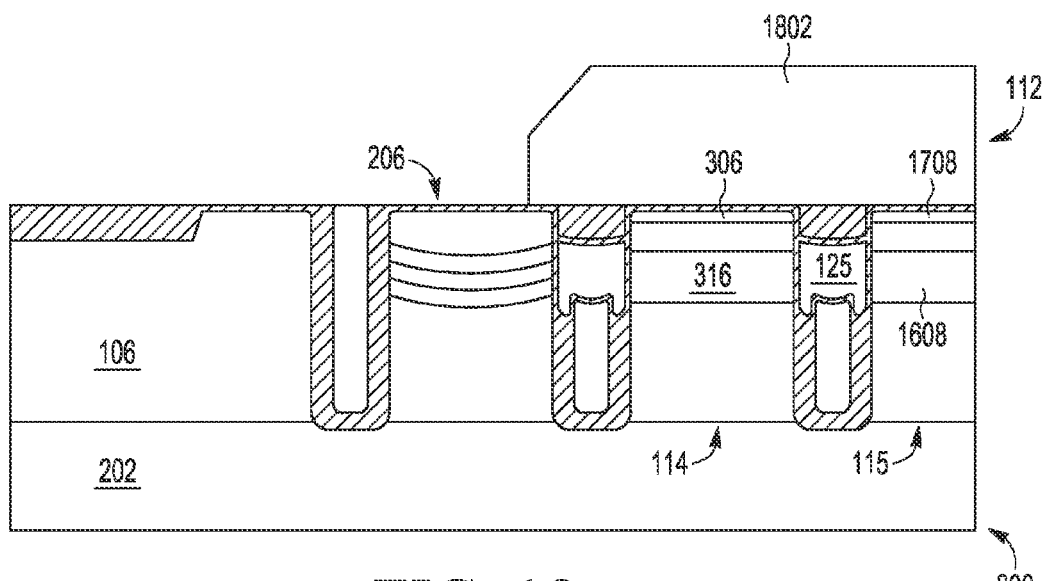
FIG. 18 is a cross-section view of the workpiece after formation of a source electrode metallization in accordance with some embodiments.

FIG. 18 illustrates a manufacturing stage for formation of the source metallization for the source/shield terminal electrode 112 at the workpiece 800. As described above with reference to FIG. 17, the source contact regions of the mesa regions of the inner cells are formed at the semiconductor surface 206 using a blanket N+ implant process that self-aligns the source contact regions with respect to the adjacent trenches, while the trenches of the inner cells remain isolated from the semiconductor surface 206 due to the thick oxide layers overlying the trench gate electrodes in the trenches. As such, in at least one embodiment the metal or other conductive material 1802 (e.g., one or more layers of Ti, TiN, and AlCuW) of the source/shield terminal electrode 112 may be deposited directly on the semiconductor surface 206 of the workpiece 800 and then etched or otherwise formed into a specified pattern for the source/shield terminal electrode 112, such as the example pattern for the source/shield terminal electrode 112 shown in FIG. 1. This places the conductive material 1802 of the source/shield terminal electrode 112 into direct conductive contact with the source contact regions 306 and 1708 of mesa regions 134 and 135, respectively, as well as other source contact regions of the mesa regions of the inner cells, and thus eliminates the need for a contact mask to form the source contact layers in an intervening dielectric layer overlying the source contact regions.

Figure 19:
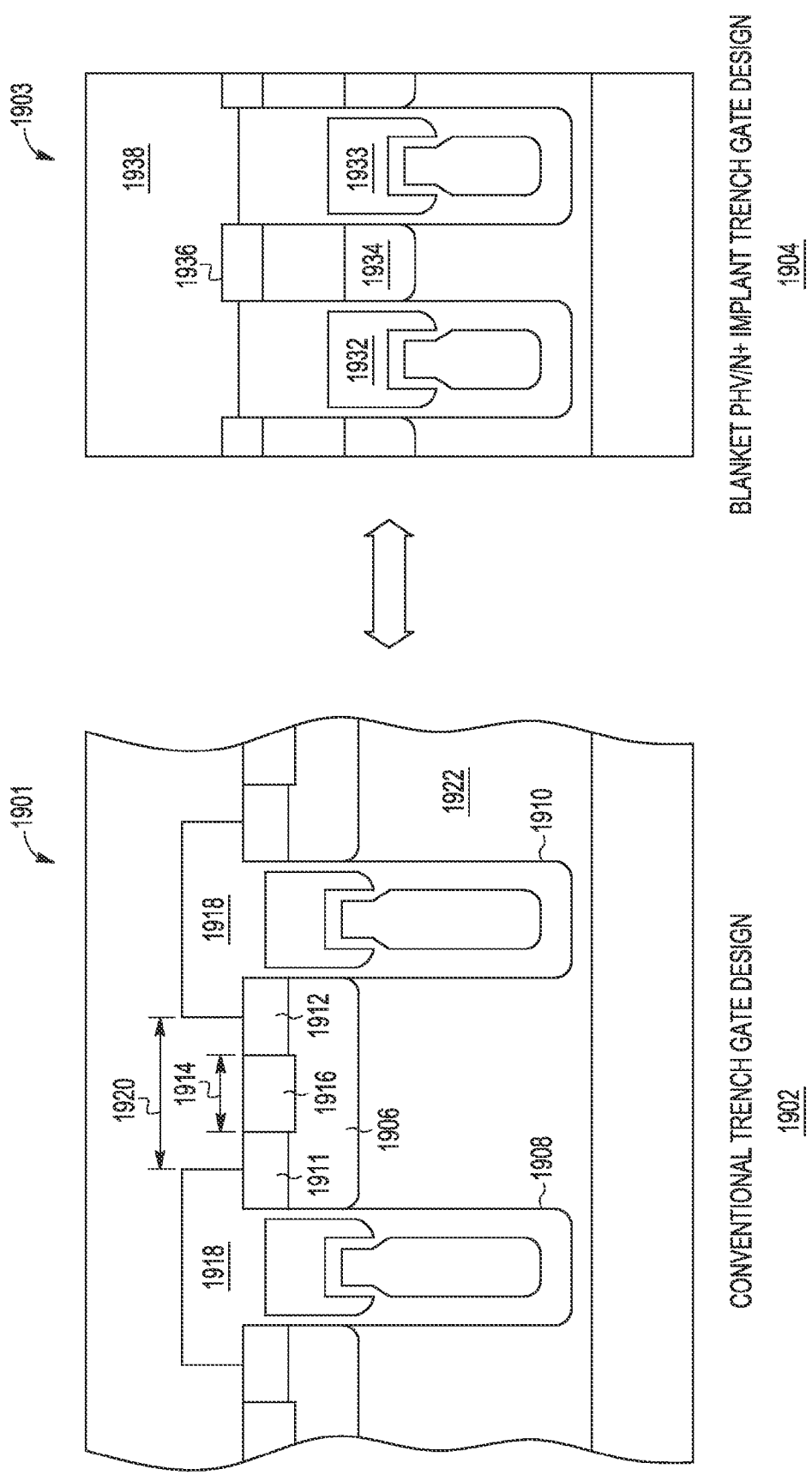
FIG. 19 is a cross-section view of a semiconductor device having cells with self-aligned source metal contacts in accordance with some embodiments.

FIG. 19 illustrates a side-by-side comparison of a cross-section view 1902 of a conventional trench gate FET 1901 and a cross-section view 1904 of a trench gate FET 1903 fabricated in accordance with the techniques described above. As illustrated by cross-section view 1902, in the conventional trench gate FET 1901 a P− body region is formed in the mesa region between two adjacent trenches 1908 and 1910, and two N+ regions 1911 and 1912 are formed using an N+ implant and an N+ block mask (not shown) to protect the illustrated region 1914 from implantation. A P+ region 1916 then is formed using a P+ implant and a P+ block mask 1918 composed of $SiO_2$ to protect gate electrodes in the trenches 1908 and 1910 and the N+ regions 1911 and 1912 from the P+ implant. A contact mask (not shown) is used to etch a contact opening 1920 in the P+ block mask 1918 to form a source contact that extends from the surface of the epi layer 1922 to the source metal 1924. Thus, under this approach, the silicon width Sx of the conventional trench gate FET 1901 (that is, the width between trenches) is constrained by the photolithography design rules for the N+ implant mask and the contact mask used to protect the P+ region 1916 and to form the contact opening 1920.

In contrast, the fabrication process for the trench gate FET 1903 described above does not require an N+ implant mask or a contact mask. Rather, as described above, the use of thick oxide layers overlying the tops of the trenched gate electrodes (e.g., thick oxide layers 1930 and 1931 overlying trench gate electrodes 1932 and 1933, respectively) and the use of buried body regions (such as buried body region 1934) permits the doping of the mesa regions in the inner cell region to occur without masks in the inner cell region. This ability to avoid the use of such masks permits the formation of a self-aligned source contact regions (e.g., source contact region 1936) and a source electrode metallization 1938 that may directly overlie the source contact regions. As the N+ implant mask and contact mask are not used, the silicon width Sx of the trench gate FET 1903 is not limited by the design rules limited by such masks, and thus the silicon width Sx between trenches may be considerably narrower than that possible in the conventional trench gate FET 1901. The reduced silicon width achievable using the fabrication techniques described herein permits the trench gate FET 1903 to exhibit a significantly enhanced RESURF effect, and thus exhibit a lower $R_{DSon}$ for a given $BV_{dss}$.

One primary factor the in the performance of a trench gate FET is the effectiveness of the edge termination structure used in the trench gate FET to control the electric field at the edges of the device. Conventional edge termination structures, such as field plates or field rings, often provide effective edge termination. However, the formation of such edge termination structures often requires a considerable number of processing steps, as well as a considerable portion of the device floorplan to implement. Moreover, the thick trench sidewall oxide and deep trenches employed in the trench gate FET designs described above often render field plates and field rings less effective as edge termination structures. FIGS. 20-23 illustrate techniques for fabricating edge termination structures that provide effective edge termination for the trench gate FET designs described above while requiring few, if any, additional processing steps.

Embodiments of the trench gate FET designs described above employ P-type body regions buried at non-zero depths below the surfaces of mesa regions of the epi layer in which the inner cells are formed. The breakdown voltage $BV_{dss}$ of the inner cell is based in part on the thickness of the region of the epi layer below the buried body region, which in turn defines the RESURF area or depletion region for the cell. The thicker this region, the higher the $BV_{dss}$, and vice versa. As an effective edge termination structure provides a higher $BV_{dss}$ than the $BV_{dss}$ of the inner cells, in at least one embodiment the trench gate FET 102 leverages this relationship between buried body region depth and $BV_{dss}$ by providing one or more termination cells at the edges of the trench gate FET 102 with a body region formed at a shallower depth than the depth of the buried body regions of the inner cells. With this configuration, the termination cells exhibit a higher $BV_{dss}$ than the inner cells, and thus provide effective electric field dissipation at the edge of the trench gate FET 102.

Figure 20:
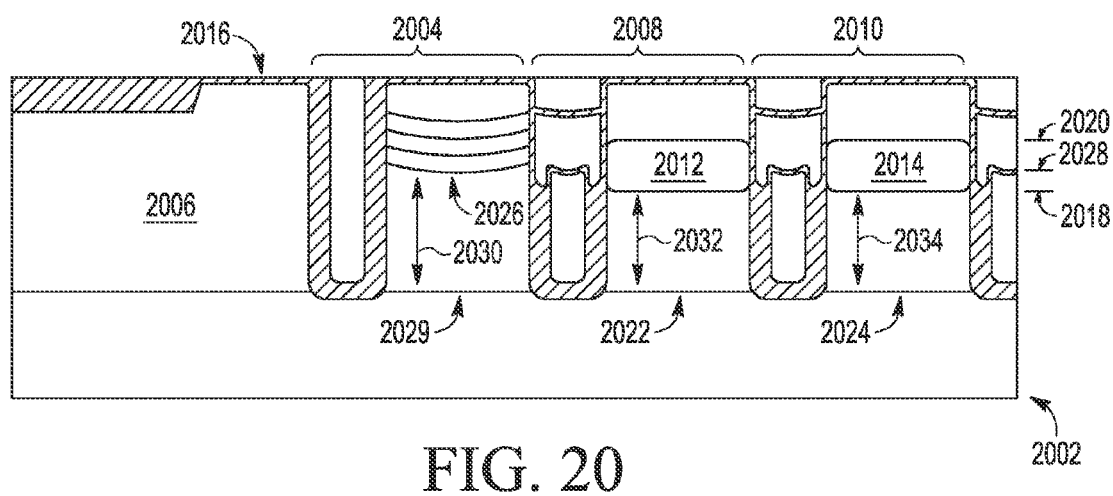
FIG. 20 is a cross-section view of a semiconductor device including a termination cell having a shield trench and a mesa region with a shallow body link region in accordance with some embodiments.

The shallower body region formed in the termination cells may be formed using any of a variety of techniques. FIG. 20 illustrates one example approach using a body link region in the termination cells. In the depicted cross-section view of a trench gate FET 2002 (one embodiment of the trench gate FET 102), a termination cell 2004 is formed at the edge of an array of active cells, including active cells 2008 and 2010. The active cells 2008 and 2010 include buried body regions 2012 and 2014, respectively, formed beneath a surface 2016 of an epi layer 2006 in which the cells 2004, 2008, and 2010 are formed. In the depicted example, the buried body regions 2012 and 2014 extend between a lower depth 2018 and an upper depth 2020 in mesa regions 2022 and 2024, respectively, of the epi layer 2006. The termination cell 2004 includes a body link region 2026 formed in a mesa region 2029 of the epi layer 2006. The body link region 2026 extends from the surface 2016 to a depth 2028 in the epi layer 2006, where the depth 2028 is less than the depth 2018. As illustrated by FIG. 3 above, the body link region 2026 may be conductively connected to the body terminal electrode 108 via a P+ body contact and a conductive plug. In this configuration, the thickness 2030 of the epi layer 2006 in the region underneath the body link region 2026 is greater than the thicknesses 2032 and 2034 of the epi layer 2006 in the regions underneath the buried body regions 2012 and 2014, respectively. As such, the termination cell 2004 exhibits a greater $BV_{dss}$ than that of the inner cells 2008 and 2010.

Figure 21:
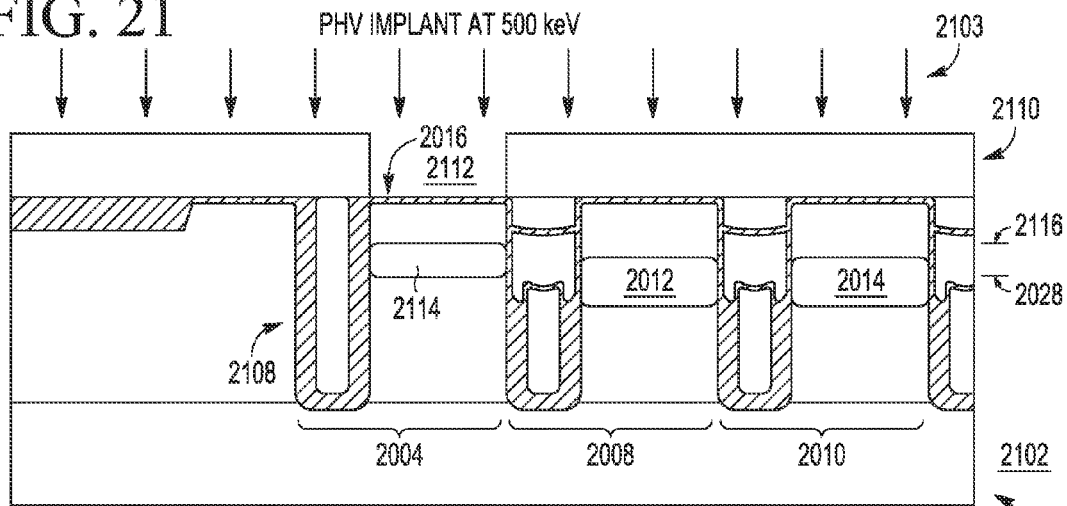
FIG. 21 illustrates a cross-section view of a workpiece during a chained ion implant process to form the semiconductor device of FIG. 20 in accordance with some embodiments.
Figure 22:
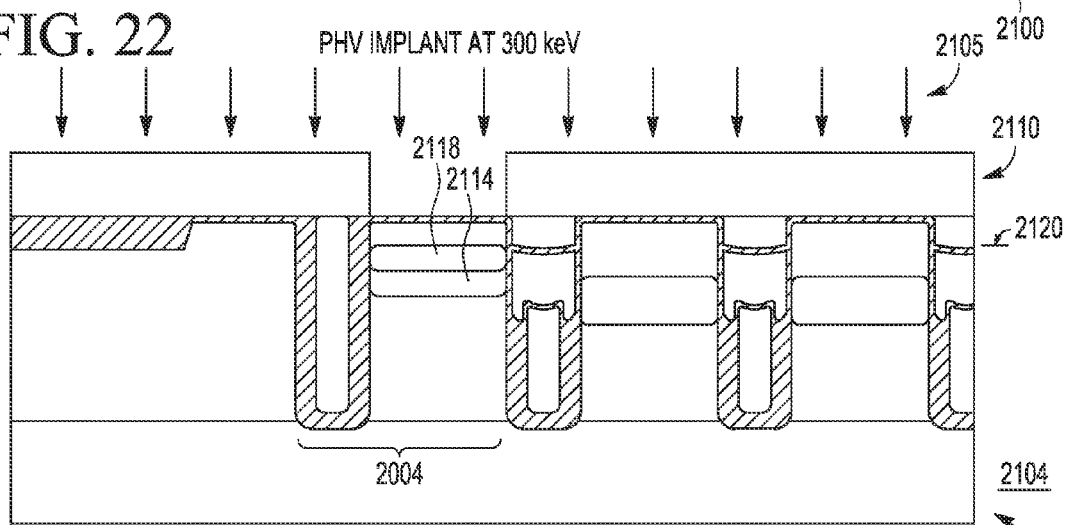
FIG. 22 illustrates another cross-section view of the workpiece of FIG. 21 during the chained ion implant process to form the semiconductor device of FIG. 20 in accordance with some embodiments.
Figure 23:
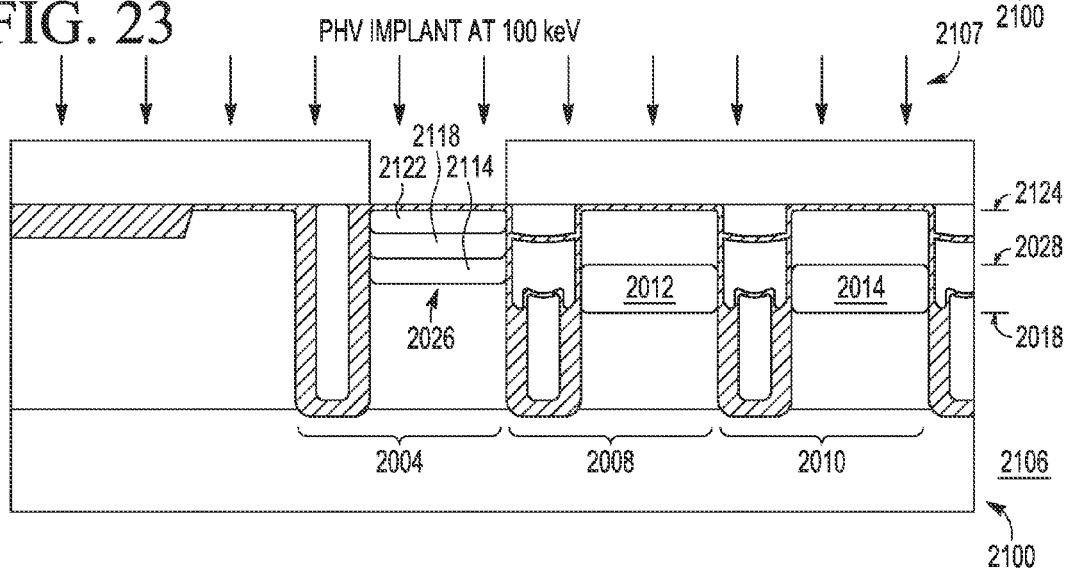
FIG. 23 illustrates yet another cross-section view of the workpiece of FIG. 21 during the chained ion implant process to form the semiconductor device of FIG. 20 in accordance with some embodiments.

FIGS. 21-23 illustrate an example process for forming the body link region 2026 in the termination cell 2004 of the trench gate FET 2002 of FIG. 20 in accordance with at least one embodiment. At the manufacturing stage represented by cross-section view 2102 of FIG. 21, the inner cells 2008 and 2010 have been formed with their corresponding buried body regions 2012 and 2014, respectively, in a workpiece 2100 and a termination trench 2108 has been formed for the termination cell 2004. In this example, the buried body regions 2012 and 2014 are formed through a PHV implant using Boron at an implant energy of 850 keV.

An implant mask layer 2110 composed of photoresist or other suitable material is deposited or otherwise formed at the surface 2016 of the epi layer 2006. An opening 2112 aligned with the mesa region 2029 is etched or otherwise formed in the implant mask layer 2110. With the opening 2112 in the implant mask layer 2110 so formed, the workpiece 2100 is subjected to a chained implant process to form the body link region 2026. In the depicted example of FIG. 21, the chained implant process is implemented as a series of three implants at decreasing implant energies. However, the chained implant process is not limited to this example, and instead may utilize a series of two implants, or a series of four or more implants, and the implant energies may increase through process, decrease through the process, or occur in any other order.

As illustrated by cross-section view 2102 of FIG. 22, the chained implant process begins with an initial Plink implant process 2103 using Boron as the dopant at an implant energy of, for example, between 400 and 600 keV, and preferably 500 keV, which forms a body region 2114 at a depth 2116 below the surface 2016, and extending to the depth 2028. As illustrated by cross-section view 2104, in the next stage of the chained implant process, a Plink implant process 2105 is performed using Boron as the dopant at an implant energy of, for example, between 200 and 400 keV, and preferably 300 keV, thereby forming a body region 2118 at a depth 2120 below the surface 2016, and which overlaps with the body region 2114. As illustrated by cross-section view 2106, in a final stage of the chained implant process of this example a Plink implant process 2107 is performed using Boron as the dopant at an implant energy of, for example, between 50 and 150 keV, and preferably 100 keV, thereby forming a body region 2122 that extends from the surface 2016 to a depth 2124 below the depth 2120. The resulting three overlapping body regions 2114, 2118, and 2122 together form the body link region 2026, which extends from the surface 2016 to the depth 2028, which is significantly shallower than the depth 2018 reached by the buried body regions 2012 and 2014 of the inner cells 2008 and 2010.

In at least one embodiment, the body link region 2026 is formed using the same implant mask and chained implant process used to form the other body link regions of the trench gate FET, such as the body link region 325 formed in the mesa region 135 (see FIG. 3) and the body link region 402 formed in the mesa region 142 (see FIG. 4). That is, the implant mask layer 2110 may include the same implant mask used to form these other body link regions. In such instances, implementation of the body link region 2026 does not require additional mask work or separate implant processes and thus contributes to effective edge termination without additional fabrication steps.

Figure 24:
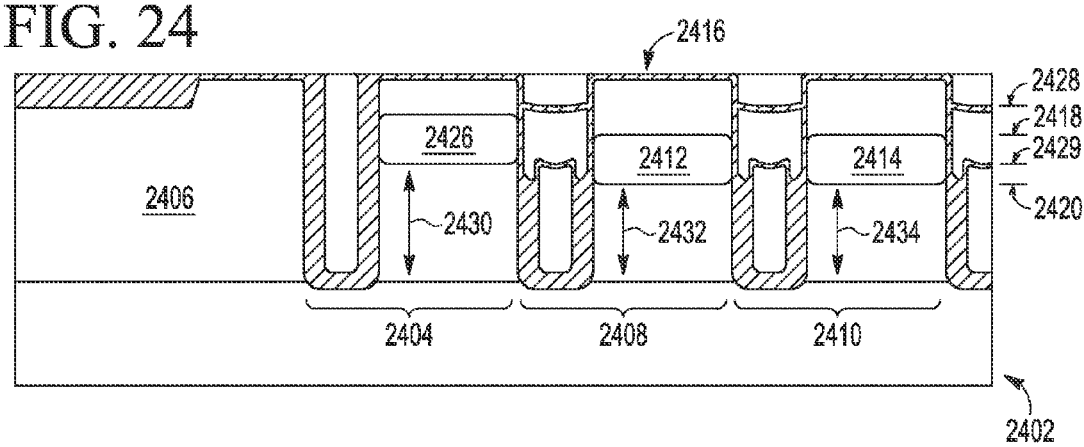
FIG. 24 is a cross-section view of a semiconductor device including a termination cell having a shield trench and a mesa region with a shallow buried region in accordance with some embodiments.

FIG. 24 illustrates another example approach for using a shallow body region in the termination cells for effective edge termination. In this approach, rather than using a body link region in the termination cell, a buried body region is formed in the termination cell at a lower implant energy than the buried body regions formed in the inner cells, thereby placing the buried body region in the termination cell at a shallower depth than the buried body regions in the inner cells. To illustrate, in the depicted cross-section view of a trench gate FET 2402 (one embodiment of the trench gate FET 102), a Plink implant at a higher implant energy (e.g., 850 keV) is performed to form buried body regions 2412 and 2414 in the mesa regions of active cells 2408 and 2410, respectively. The buried body regions 2412 and 2414 extend between upper depth 2418 and lower depth 2420 below a surface 2416 of an epi layer 2406 in which the cells are formed. Another Plink implant at a lower implant energy (e.g., 500 keV) is performed to form a buried body region 2426 in a mesa region of a termination cell 2404 at the edge of an array of active cells. With this lower implant energy, the buried body region 2426 extends between an upper depth 2428 (shallower than the upper depth 2418) and a lower depth 2429 (shallower than the lower depth 2420). The buried body region 2426 is then connected to the body terminal electrode 108 using a body link region and body contact region as described in detail above. In this configuration, the thickness 2430 of the region of the epi layer 2406 underneath the buried body region 2426 is greater than the thicknesses 2032 and 2034 of regions of the epi layer 2406 underneath the buried body regions 2412 and 2414, respectively. As such, the termination cell 2404 exhibits a higher $BV_{dss}$ than the inner cells 2408 and 2410.

Figure 25:
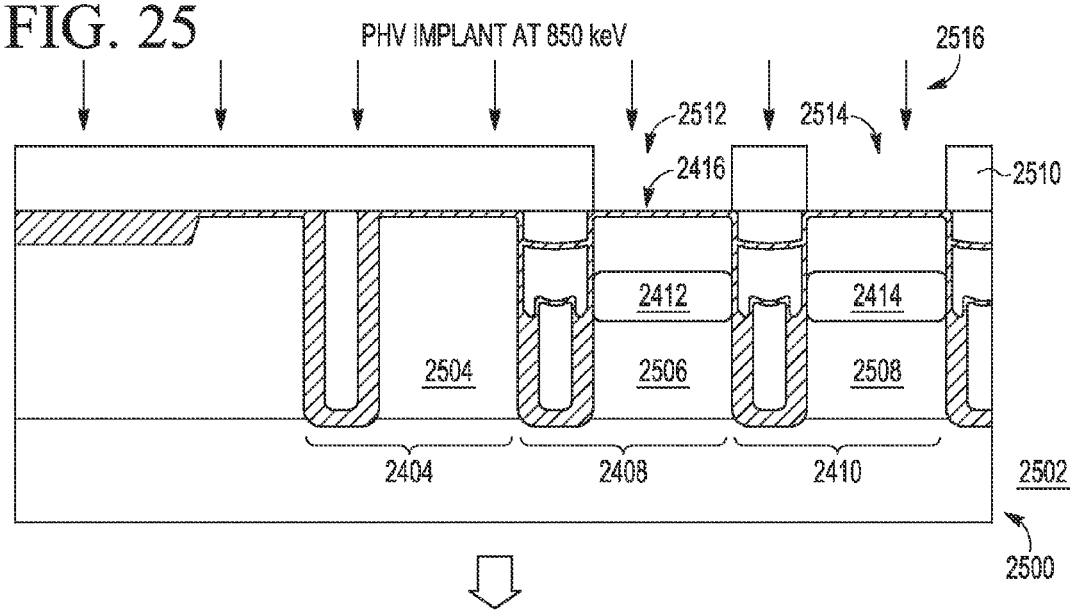
FIG. 25 illustrates a cross-section view of a workpiece during two separate high-voltage ion implant processes to form the semiconductor device of FIG. 24 in accordance with some embodiments.
Figure 26:
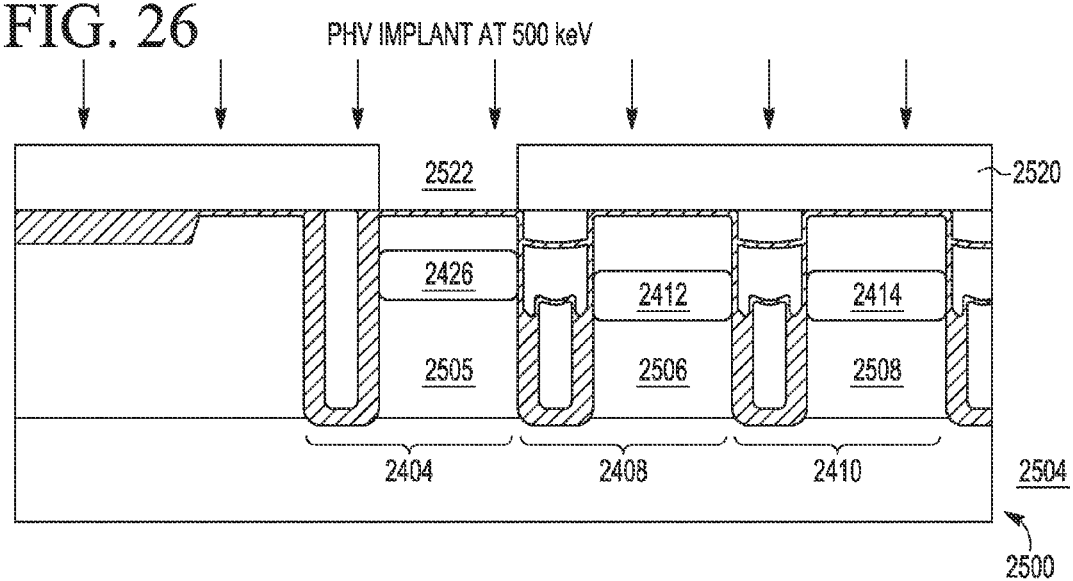
FIG. 26 illustrates another cross-section view of the workpiece of FIG. 25 during the two separate high-voltage ion implant processes to form the semiconductor device of FIG. 24 in accordance with some embodiments.

FIGS. 25 and 26 illustrate an example process for forming the body region 2426 in the termination cell 2404 of the trench gate FET 2402 of FIG. 24 in accordance with at least one embodiment. At the manufacturing stage represented by cross-section view 2502 of FIG. 25, a workpiece 2500 has been formed with termination trenches and active trenches defining mesa regions 2505, 2506, and 2508 for the termination cell 2404, the inner cell 2408, and the inner cell 2410, respectively. An implant mask layer 2510 composed of photoresist or other suitable material is formed overlying the surface 2416 and then openings 2512 and 2514 aligned with the mesa regions 2506 and 2508, respectively, are etched or otherwise formed in the implant mask layer 2310. A PHV implant 2516 is performed using Boron as the dopant at an implant energy of between 700 and 900 keV, and preferably 850 keV, to form the buried body regions 2412 and 2414.

At the manufacturing stage represented by cross-section view 2504 of FIG. 26, the implant mask layer 2510 has been stripped or otherwise removed from the workpiece 2300 and another implant mask layer 2520 is formed overlying the surface 2416. An opening 2522 aligned with the mesa region 2505 of the termination cell 2204 is etched or otherwise formed, and then a second Plink implant 2524 is performed using Boron as a dopant at an implant energy of between 400 and 600 keV, and preferably 500 keV, to form the buried body region 2226 in the mesa region 2505 of the termination cell 2204.

In accordance with one aspect, a semiconductor device includes a substrate and a semiconductor layer disposed at the substrate and having a first conductivity type. The semiconductor device further includes first and second trenches extending into the semiconductor layer from a surface of the semiconductor layer, each of the first and second trenches including a corresponding gate electrode, and a body region disposed in the semiconductor layer below the surface of the semiconductor layer and between a sidewall of the first trench and an adjacent sidewall of a second trench, the body region having a second conductivity type different than the first conductivity type. The semiconductor device further includes a source contact region disposed in the semiconductor layer between the body region and the surface of the semiconductor layer and extending between the sidewall of the first trench and the corresponding sidewall of the second trench, the source contact region having the first conductivity type.

In one embodiment, the semiconductor layer has a first doping concentration, and the source contact region has a second doping concentration greater than the first doping concentration. In one embodiment, the source contact region extends from the surface to a first depth in the semiconductor layer, and the body region extends from a second depth to a third depth in the semiconductor layer, the second depth greater than the first depth. The first and second trenches may extend from the surface to a depth greater than the third depth. The first and second trenches each further may include a corresponding portion of a shield electrode disposed below the gate electrode. Each of the first and second trenches further may include an insulating layer between a top of the gate electrode and a top of the trench. The insulating layer may have, for example, a thickness between 0.1 to 2.0 micrometers. In one embodiment, the semiconductor layer includes an N-type semiconductor layer with a first doping concentration, the source contact region includes an N-type region with a second doping concentration greater than the first doping concentration; and the body region includes a high-voltage P-type (PHV) region.

In accordance with another aspect of the present disclosure, a method for forming a semiconductor device includes forming a plurality of trenches in a semiconductor layer of the semiconductor device, each trench having a corresponding gate electrode. The method further includes forming a plurality of body regions below a surface of the semiconductor layer, each body region extending between adjacent sidewalls of a corresponding pair of adjacent trenches of the plurality of trenches and having a second conductivity type different than a first conductivity type of the semiconductor layer. The method also includes forming a plurality of source contact regions in the semiconductor layer, each source contact region disposed between a corresponding body region of the plurality of body regions and the surface of the semiconductor layer and extending between adjacent sidewalls of a corresponding pair of adjacent trenches, the source contact region having the first conductivity type.

In one embodiment, forming the plurality of body regions includes performing a first blanket ion implant process. Further, performing the first blanket ion implant process may include performing the blanket ion implant process at an implant energy between 700 and 900 kilo-electron-volts. Forming the plurality of source regions may include performing a second blanket ion implant process. In one embodiment, forming the plurality of source regions includes performing a blanket ion implant process to form the plurality of source regions with a doping concentration higher than a doping concentration of the semiconductor layer. Forming the plurality of source contact regions may include forming the plurality of source contact regions so that each source contact region extends from the surface to a first depth in the semiconductor layer, and forming the plurality of body regions may include forming the plurality of body regions so that each body region extends from a second depth to a third depth in the semiconductor layer, the second depth greater than the first depth. In one embodiment, forming the plurality of trenches includes forming, in each trench, a corresponding portion of a shield electrode below the gate electrode. In one embodiment, forming the plurality of trenches includes forming, in each trench, an insulating layer between a top of the gate electrode and a top of the trench, wherein forming the insulating layer includes forming the oxide layer with a thickness between 0.1 to 2.0 micrometers.

In accordance with yet another aspect, a method of forming a trench power metal oxide silicon field effect transistor (MOSFET) device includes providing a workpiece including an N-type epitaxial layer formed on an N-type substrate, forming first and second trench structures extending from a surface of the epitaxial layer, each of the first and second trench structures including a gate electrode and corresponding portion of a shield electrode, performing a blanket P-type high voltage (PHV) ion implant process on the workpiece to form a P-type body region below the surface of the epitaxial layer and extending between a sidewall of the first trench structure and a sidewall of the second trench structure, and performing a blanket N-type ion implant process on the workpiece to form an N-type source contact region in the epitaxial layer and above the body region, the source contact region extending between the sidewall of the first trench structure and the sidewall of the second trench structure.

In one aspect of the present disclosure, a semiconductor device includes a semiconductor layer disposed at a substrate of the semiconductor device, the semiconductor layer having a first conductivity type, and a plurality of active cells disposed at the semiconductor layer. Each active cell includes a trench extending into the semiconductor layer from a surface of the semiconductor layer, and a body region disposed in the semiconductor layer adjacent to a sidewall of the trench of the active cell and at a first depth below the surface, the body region of the active cell having a second conductivity type different than the first conductivity type. The semiconductor device further includes a termination cell disposed at the semiconductor layer adjacent to an edge of the plurality of active cells. The termination cell includes a trench extending into the semiconductor layer from the surface of the semiconductor layer, and a body region disposed in the semiconductor layer adjacent to a sidewall of the trench of the termination cell and at a second depth less than the first depth, the body region of the termination cell having the second conductivity type.

In one embodiment, the second depth is at the surface, the body region of the termination cell extends from the surface to a third depth, and the body regions of the active cells extend from the first depth to a fourth depth, the fourth depth greater than the third depth. In one embodiment, the semiconductor device further includes a segment of a shield electrode disposed in the trench of the termination cell, and corresponding segments of the shield electrode disposed underneath gate electrodes in the trenches of the active cells. In one embodiment, each active cell further includes a first body contact region extending from the body region of the active cell to the surface of the semiconductor layer, and the termination cell further includes a second body contact region extending from the body region of the termination cell to the surface of the semiconductor layer. The semiconductor device further includes conductive plugs contacting the first and second body contact regions and a body electrode contacting the conductive plugs.

In accordance with another aspect, a method for forming a semiconductor device includes providing a semiconductor layer overlying a substrate, the semiconductor layer having a first conductivity type, forming, for each active cell of a plurality of active cells, a trench extending into the semiconductor layer from a surface of the semiconductor layer, forming, for a termination cell at a periphery of the plurality of active cells, a trench adjacent to at least one edge of the plurality of active cells at the semiconductor layer, the trench extending into the semiconductor layer from the surface of the semiconductor layer, forming, for each active cell of the plurality of active cells, a first body region at a first depth in the semiconductor layer and adjacent to a sidewall of the trench of the active cell, the first body region having a second conductivity type different than the first conductivity type, and forming, for the termination cell, a second body region at a second depth in the semiconductor layer and adjacent to a sidewall of the trench of the termination cell, the second body region having the second conductivity type and the second depth being less than the first depth.

In one embodiment, forming the first body region includes performing a first ion implant process at a first implant energy level, and forming the second body region comprises performing a second ion implant process at a second implant energy level lower than the first implant energy level. Forming the first body region can include implementing a first mask during the first ion implant process to prevent ion implantation in the second body region during the first ion implant process, and forming the second body region can include implementing a second mask during the second ion implant process to prevent ion implantation in the first body region of each of the active cells during the second ion implant process. Performing the first ion implant process can include performing a P-type implant process at an implant energy in a range of approximately 700 to 900 kilo-electron-volts, and performing the second ion implant process comprises performing a P-type implant process at an implant energy in a range of approximately 400 to 600 kilo-electron-volts. The method further can include forming, for each active cell of the plurality of active cells, a body contact region overlying the first body region of the active cell at the surface of the semiconductor layer using a chained ion implant process, the chained ion implant process comprising a series of ion implant processes at different implant energies and forming, for the termination cell, a body contact region overlying the second body region at the surface of the semiconductor layer using the chained ion implant process. The method also may include forming, for each active cell, a first conductive plug contacting the body contact region of the active cell, forming a second conductive plug contacting the body contact region of the termination cell, and forming a body electrode contacting the first and second conductive plugs. In one embodiment, forming the first body region includes performing a single ion implant process at a first implant energy level, and forming the second body region includes performing a chained ion implant process that uses a series of ion implant processes at different implant energies. The ion implant process at the first implant energy level is one of the ion implant processes of the chain ion implant process. Forming the second body region can include forming the second body region at a non-zero depth below the surface of the semiconductor layer. In one embodiment, the method further includes forming, for each active cell of the plurality of active cells, a body contact region overlying the first body region of the active cell at the surface of the semiconductor layer using the chained ion implant process, forming a conductive plug contacting the body contact region, and forming a body electrode contacting the conductive plug. In one embodiment, forming the trench of each active cell comprises forming a corresponding segment of a shield electrode in the trench of the active cell, and forming the trench of the termination cell comprises forming a corresponding segment of the shield electrode in the trench of the termination cell. In one embodiment, providing the semiconductor layer overlying the substrate includes epitaxially growing the semiconductor layer on the substrate. In one embodiment, the second depth is at the surface of the semiconductor layer.

In accordance with yet another aspect, a semiconductor device includes an active cell including a first trench extending into a semiconductor layer of the semiconductor device, the first trench comprising a segment of a gate electrode overlying a segment of a shield electrode and a first body region disposed below a surface of the semiconductor layer and adjacent to the first trench, the first body region extending to a first depth below the surface of the semiconductor layer and having a conductivity type different than a conductivity type of the semiconductor layer. The semiconductor device further includes a termination cell disposed at the semiconductor layer adjacent to the active cell. The termination cell includes a second trench extending into the semiconductor layer of the semiconductor device, the second trench comprising a segment of the gate electrode overlying a segment of the shield electrode, and a second body region disposed adjacent to the second trench, the second body region extending from the surface of the semiconductor layer to a second depth below the surface of the semiconductor layer that is less than the first depth, and the second body region having a conductivity type different than the conductivity type of the semiconductor layer.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A semiconductor device comprising:
   a semiconductor layer disposed at a substrate of the semiconductor device, the semiconductor layer having a first conductivity type;
   a plurality of active cells disposed at the semiconductor layer, each active cell comprising:
      a trench extending into the semiconductor layer from a surface of the semiconductor layer;
      a body region disposed in the semiconductor layer adjacent to a sidewall of the trench of the active cell and at a first depth below the surface such that the entirety of the body region is separated from the surface by a directly interposing region of the semiconductor layer, the body region of the active cell having a second conductivity type different than the first conductivity type; and
      a first body contact region extending from the body region of the active cell to the surface of the semiconductor layer, and
   a termination cell disposed at the semiconductor layer adjacent to an edge of the plurality of active cells, the termination cell comprising:
      a trench extending into the semiconductor layer from the surface of the semiconductor layer;
      a body region disposed in the semiconductor layer adjacent to a sidewall of the trench of the termination cell and at a second depth less than the first depth, the body region of the termination cell having the second conductivity type; and
      a second body contact region extending from the body region of the termination cell to the surface of the semiconductor layer; and
   wherein the body region of the termination cell extends from the second depth to a third depth at its lowermost depth, and the body regions of the active cells extend from the first depth to a fourth depth at their lowermost depths, the fourth depth greater than the third depth.

2. The semiconductor device of claim 1, wherein the second depth is at the surface.

3. The semiconductor device of claim 1, further comprising:
   a segment of a shield electrode disposed in the trench of the termination cell.

4. The semiconductor device of claim 3, further comprising:
   corresponding segments of the shield electrode disposed underneath gate electrodes in the trenches of the active cells.

5. The semiconductor device of claim 1, wherein the semiconductor device further comprises:
   conductive plugs contacting the first and second body contact regions; and
   a body electrode contacting the conductive plugs.

6. A method for forming a semiconductor device, the method comprising:
   providing a semiconductor layer overlying a substrate, the semiconductor layer having a first conductivity type;
   forming, for each active cell of a plurality of active cells, a trench extending into the semiconductor layer from a surface of the semiconductor layer;
   forming, for a termination cell at a periphery of the plurality of active cells, a trench adjacent to at least one edge of the plurality of active cells at the semiconductor layer, the trench extending into the semiconductor layer from the surface of the semiconductor layer;
   forming, for each active cell of the plurality of active cells, a first body region at a first depth below the surface in the semiconductor layer and adjacent to a sidewall of the trench of the active cell such that the entirety of the first body region is separated from the surface by a directly interposing region of the semiconductor layer, the first body region having a second conductivity type different than the first conductivity type;
   forming, for each active cell of the plurality of cells, a first body contact region extending from the first body region of the active cell to the surface of the semiconductor layer;
   forming, for the termination cell, a second body region at a second depth in the semiconductor layer adjacent to a sidewall of the trench of the termination cell, the second body region having the second conductivity type and the second depth being less than the first dept;
   forming, for the termination cell, a second body contact region extending from the second body region of the termination cell to the surface of the semiconductor layer; and
   wherein the second body region of the termination cell extends from the second depth to a third depth at its lowermost depth, and the first body region of the cells extend from the first depth to a fourth depth at their lowermost depths, the fourth depth greater than the third depth.

7. The method of claim 6, wherein:
   forming the first body region comprises performing a first ion implant process at a first implant energy level; and
   forming the second body region comprises performing a second ion implant process at a second implant energy level lower than the first implant energy level.

8. The method of claim 7, wherein:
   forming the first body region comprises implementing a first mask during the first ion implant process to prevent ion implantation in the second body region during the first ion implant process; and forming the second body region comprises implementing a second mask during the second ion implant process to prevent ion implantation in the first body region of each of the active cells during the second ion implant process.

9. The method of claim 7, wherein:
performing the first ion implant process comprises performing a P-type implant process at an implant energy in a range of approximately 700 to 900 kilo-electron-volts; and
performing the second ion implant process comprises performing a P-type implant process at an implant energy in a range of approximately 400 to 600 kilo-electron-volts.

10. The method of claim 7, wherein:
forming the first body contact region comprises forming the first body contact region using a chained ion implant process, the chained ion implant process comprising a series of ion implant processes at different implant energies; and
forming the second body contact region comprises forming the second body contact region using the chained ion implant process.

11. The method of claim 10, further comprising:
forming, for each active cell, a first conductive plug contacting the first body contact region of the active cell;
forming a second conductive plug contacting the second body contact region of the termination cell; and
forming a body electrode contacting the first and second conductive plugs.

12. The method of claim 6, wherein:
forming the first body region comprises performing a single ion implant process at a first implant energy level; and
forming the second body region comprises performing a chained ion implant process that uses a series of ion implant processes at different implant energies.

13. The method of claim 12, wherein the ion implant process at the first implant energy level is one of the ion implant processes of the chain ion implant process.

14. The method of claim 12, wherein forming the second body region comprises forming the second body region at a non-zero depth below the surface of the semiconductor layer.

15. The method of claim 12, further comprising:
forming, for each active cell, a conductive plug contacting the first body contact region of the active cell; and
forming a body electrode contacting the conductive plug.

16. The method of claim 6, wherein:
forming the trench of each active cell comprises forming a corresponding segment of a shield electrode in the trench of the active cell; and
forming the trench of the termination cell comprises forming a corresponding segment of the shield electrode in the trench of the termination cell.

17. The method of claim 6, wherein providing the semiconductor layer overlying the substrate comprises epitaxially growing the semiconductor layer on the substrate.

18. The method of claim 6, wherein the second depth is at the surface of the semiconductor layer.

19. A semiconductor device comprising:
an active cell comprising:
a first trench extending into a semiconductor layer of the semiconductor device, the first trench comprising a segment of a gate electrode overlying a segment of a shield electrode; and
a first body region disposed below a surface of the semiconductor layer and adjacent to the first trench such that the entirety of the first body region is separated from the surface by a directly interposing region of the semiconductor layer, the first body region extending, at its greatest extent, to a first depth below the surface of the semiconductor layer and having a conductivity type different than a conductivity type of the semiconductor layer; and
a first body contact region extending from the body region of the active cell to the surface of the semiconductor layer; and
a termination cell disposed at the semiconductor layer adjacent to the active cell, the termination cell comprising:
a second trench extending into the semiconductor layer of the semiconductor device, the second trench comprising a segment of the gate electrode overlying a segment of the shield electrode;
a second body region disposed adjacent to the second trench, the second body region extending from the surface of the semiconductor layer to a second depth below the surface of the semiconductor layer that is less than the first depth, and the second body region having a conductivity type different than the conductivity type of the semiconductor layer; and
a second body contact region extending form the first body region of the active cell to the surface if the semiconductor layer, and
wherein the second body region of the termination cell extends from the second depth to a third depth at its greatest extent, and the first body region of the active cells extends from the first depth to a fourth depth at its greatest extent, the fourth depth greater than the third depth.

* * * * *